United States Patent [19]

Cornish et al.

[11] Patent Number: 5,321,710

[45] Date of Patent: Jun. 14, 1994

[54] PREDISTORTION METHOD AND APPARATUS FOR LASER LINEARIZATION

[75] Inventors: Peter W. Cornish, Pleasanton; Barry Duncan, San Jose, both of Calif.

[73] Assignee: Raynet Corporation, Menlo Park, Calif.

[21] Appl. No.: 49,760

[22] Filed: Apr. 19, 1993

[51] Int. Cl.$^5$ .............................................. H01S 3/10
[52] U.S. Cl. .................................... 372/26; 372/29;
372/38; 372/31; 372/32; 330/149; 330/163;
330/124 R; 359/109
[58] Field of Search ....................... 372/26, 29, 38, 31,
372/32; 330/149, 163, 124; 455/609

[56] References Cited

U.S. PATENT DOCUMENTS

| | | | |
|---|---|---|---|
| 3,202,928 | 8/1965 | Prior | 330/124 |
| 3,457,516 | 7/1969 | Blalock | 328/165 |
| 4,068,186 | 1/1978 | Sato et al. | 330/149 |
| 4,075,474 | 2/1978 | Straus et al. | 250/199 |
| 4,611,352 | 9/1986 | Fujito et al. | 455/609 |
| 4,672,192 | 6/1987 | Muka et al. | 250/205 |
| 4,733,398 | 3/1988 | Shibagaki et al. | 372/31 |
| 4,992,754 | 2/1991 | Blauvelt et al. | 330/149 |
| 5,012,475 | 4/1991 | Campbell | 372/29 |
| 5,080,506 | 1/1992 | Campbell et al. | 385/29 |
| 5,132,639 | 7/1992 | Blauvelt et al. | 330/149 |

FOREIGN PATENT DOCUMENTS

407919A2  7/1989  European Pat. Off. .

OTHER PUBLICATIONS

Patterson et al., "Linearization of Multichannel Analog Optical Transmitters by Quasi-Feedforward Compensation Technique", IEEE Transactions on Communications, pp. 582-588, vol. COM-27, No. 3, Mar. 1979.

Franckart et al., "Analog Transmission of TV-Channels on Optical Fibers, with Non-Linearities Correction by Regulator Feedforward", ECOC 83-9th European Conference on Optical Communication, pp. 347-350.

Bertelsmeier et al., "Linearization of Broadband Optical Transmission Systems by Adaptive Predistortion", Frequenz, vol. 38, No. 9, pp. 206-212, Sep. 1984.

Karam et al., "Analysis of Predistortion, Equalization, and ISI Cancellation Techniques in Digital Radio Systems with Nonlinear Transmit Amplifiers", pp. 1245-1253, IEEE Transactions on Communications, vol. 37, No. 12, Dec. 1989.

Kumar et al., "Broadband and Broad Dynamic Range GaAs Dual-Gate Mesfet Linearizer for TWTA and SSPA Used in Satellite Transponder", 1985 IEEE MTT-S Digest, pp. 609-612.

Lenz, "Linearization of Radio-Relay Transmitters by a Predistortion Upconverter", Conference Proceedings, 11th European Microwave Conference 81, Sep. 1981, pp. 209-214.

(List continued on next page.)

Primary Examiner—Georgia Y. Epps
Attorney, Agent, or Firm—Herbert G. Burkard

[57] ABSTRACT

A predistortion circuit reduces composite second order intermodulation distortion products inherently generated by a laser diode. A radio frequency signal is split into a primary and secondary signal, and the secondary signal is amplified by an amplifier biased at a starvation current level so as to produce intermodulation distortion products having an amplitude relatively large compared to an amplitude of a fundamental generated by the amplifier. The amplitude and phase of composite second order intermodulation distortion products generated by the amplifier are adjusted so as to substantially match those inherently generated by the laser diode by the primary electrical signal, with the products being about 180° out of phase relative to those generated by the laser in response to the primary signal. The adjusted distortion products are combined with the primary electrical signal, and the combined signal is fed to the laser diode resulting in an output of the laser diode having minimum composite second order intermodulation distortion products.

12 Claims, 22 Drawing Sheets

OTHER PUBLICATIONS

Kathiravan et al., "Combining Prefiltering and Predistortion in a High Power Direct PSK Modulator", 1990 IEEE MTT-S Digest, pp. 877-880, 1990 IEEE MTT-S International Microwave Symposium Digest, vol. II, May 1990.

Gysel et al., "Electrical Predistortion to compensate for combined Effect of Laser Chirp and Fibre Dispersion", pp. 421-423, Electronics Letters, 28th Feb. 1991, vol. 27, No. 5.

deRidder et al., "Feedfoward compensation of integrated optic modulator distortion", 78/OFC'90/Wednesday Afternoon, 2:15PM.

Childs et al., "Predistortion linearization of directly modulated DFB lasers and external modulators for AM video transmission", OFC'90/Wednesday Afternoon/79, 2:30PM.

Nojima et al., "The design of a predistortion linearization circuit for high-level moduration radio systems", Globecom '85, IEEE Global Telecommunications Conference, Conference Record vol. 3 of 3, Dec. 1985, pp. 1466-1471.

Nojima et al., "Predistortion nonlinear compensator for microwave SSB-AM system", Electronics and Communications in Japan, vol. 67-B, No. 5, May 1984, pp. 57-66 Translated from Denshi Tsushin Gakkai Ronbunshi, vol. 67-B, No. 1, Jan. 1984, pp. 78-85.

Nojima et al., "Cuber predistortion linearizer for relay equipment in 800 MHz band land mobile telephone system", IEEE Transactions on Vehicular Technology, vol. VT-34, No. 4, Nov. 1985, pp. 169-177.

Nannicini et al., "Temperature controlled predistortion circuits for 64 AQM microwave power amplifiers", 1985 IEEE MTT-S Digest, pp. 99-102.

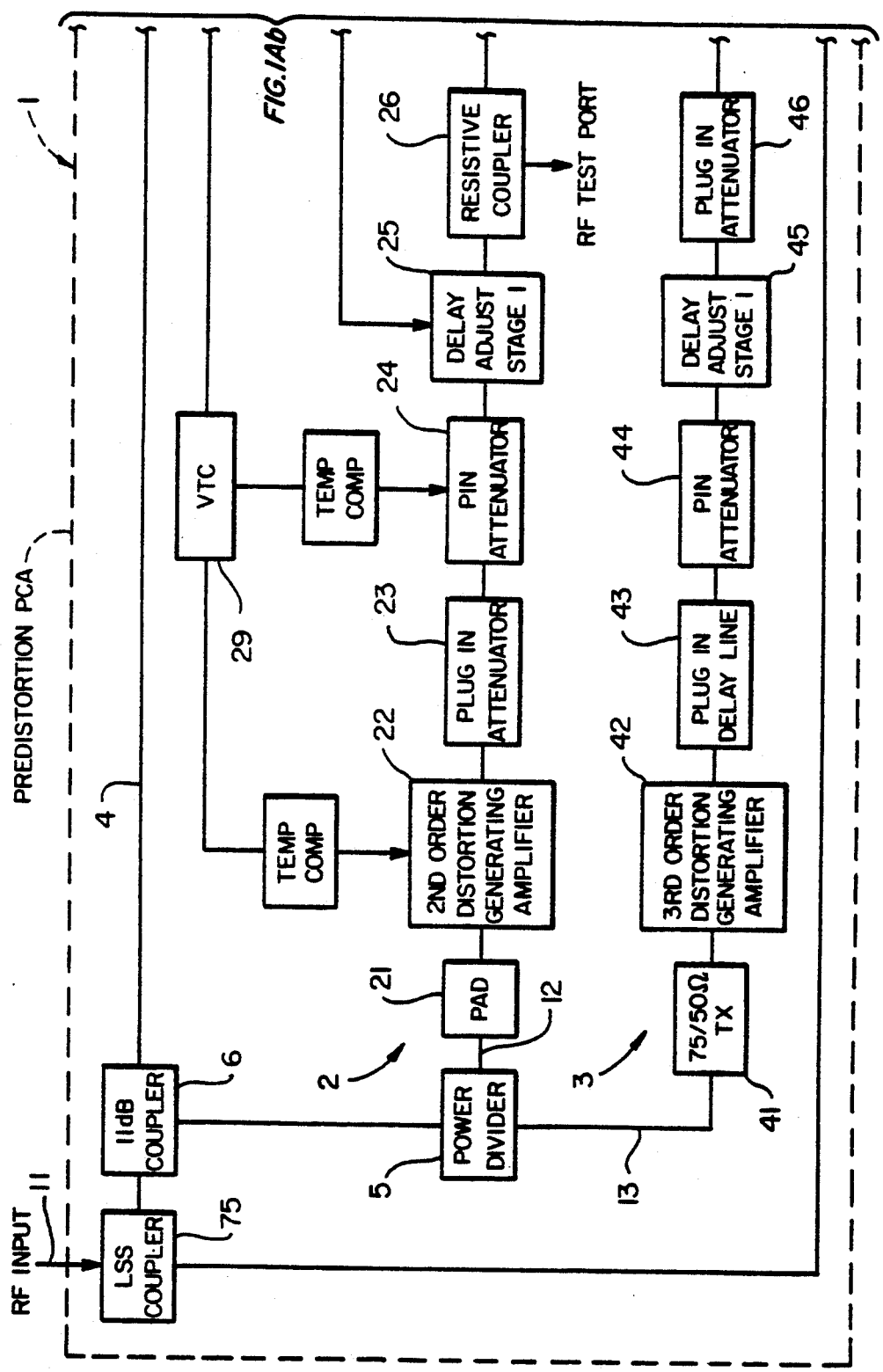

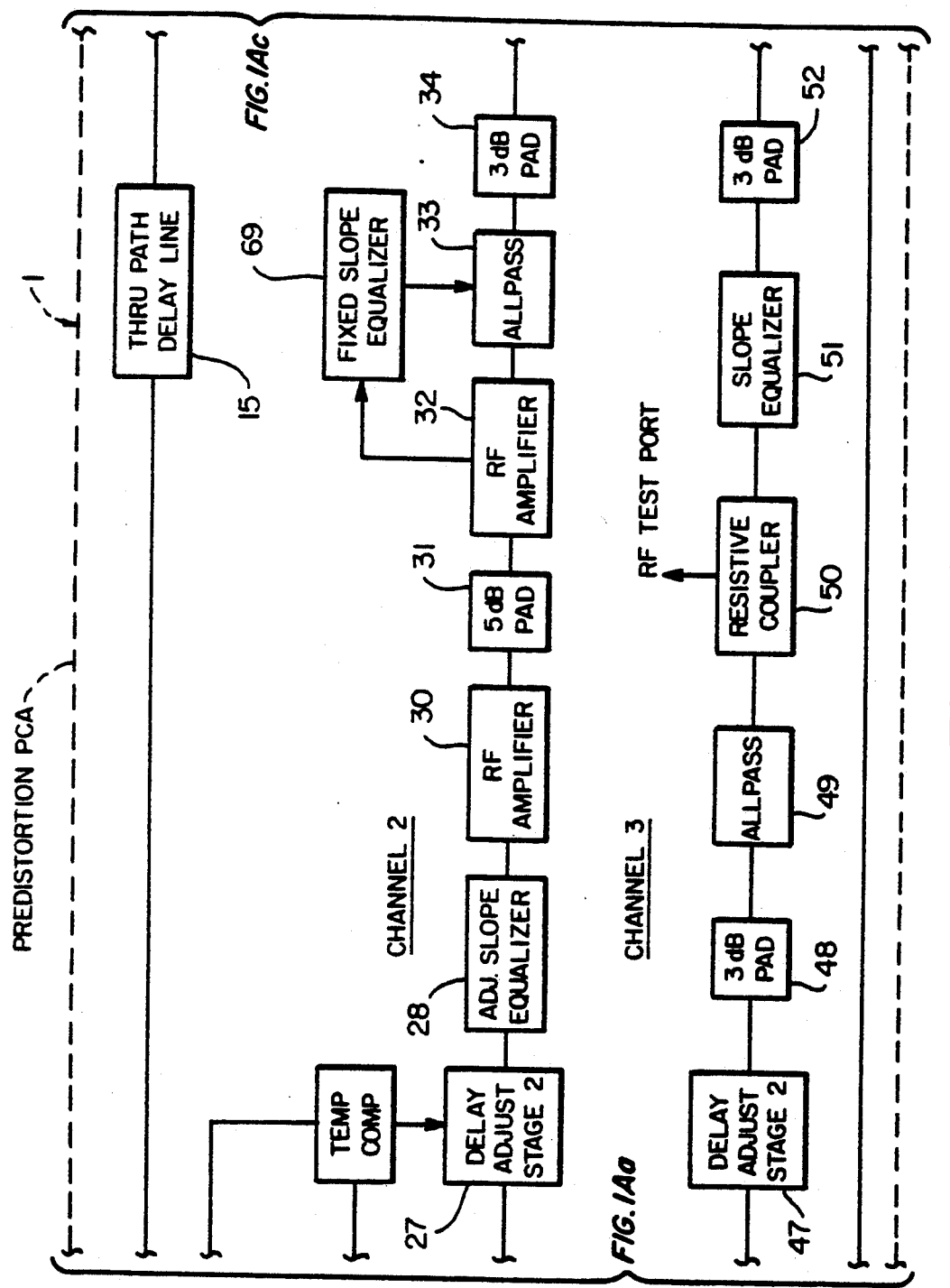

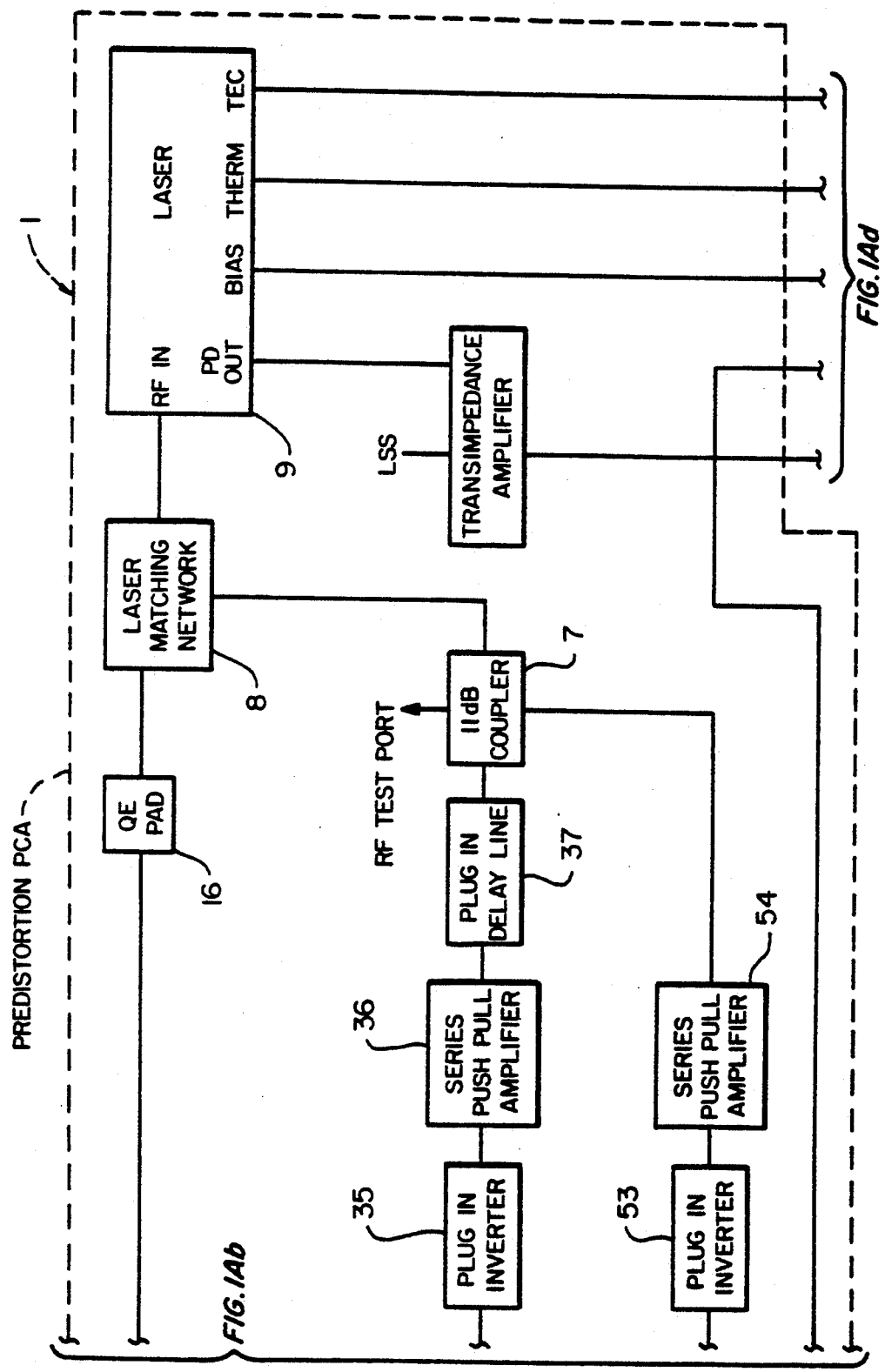

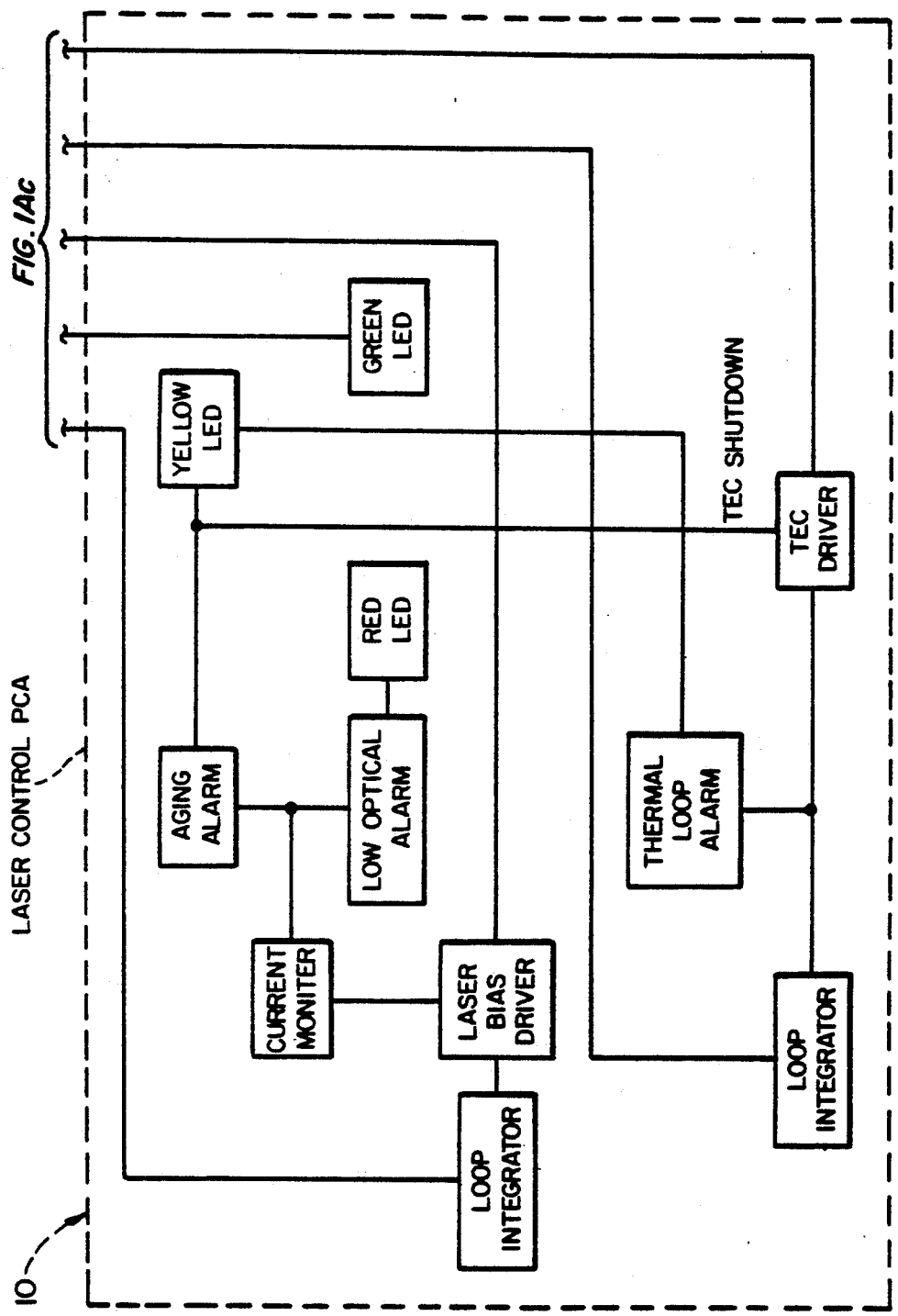

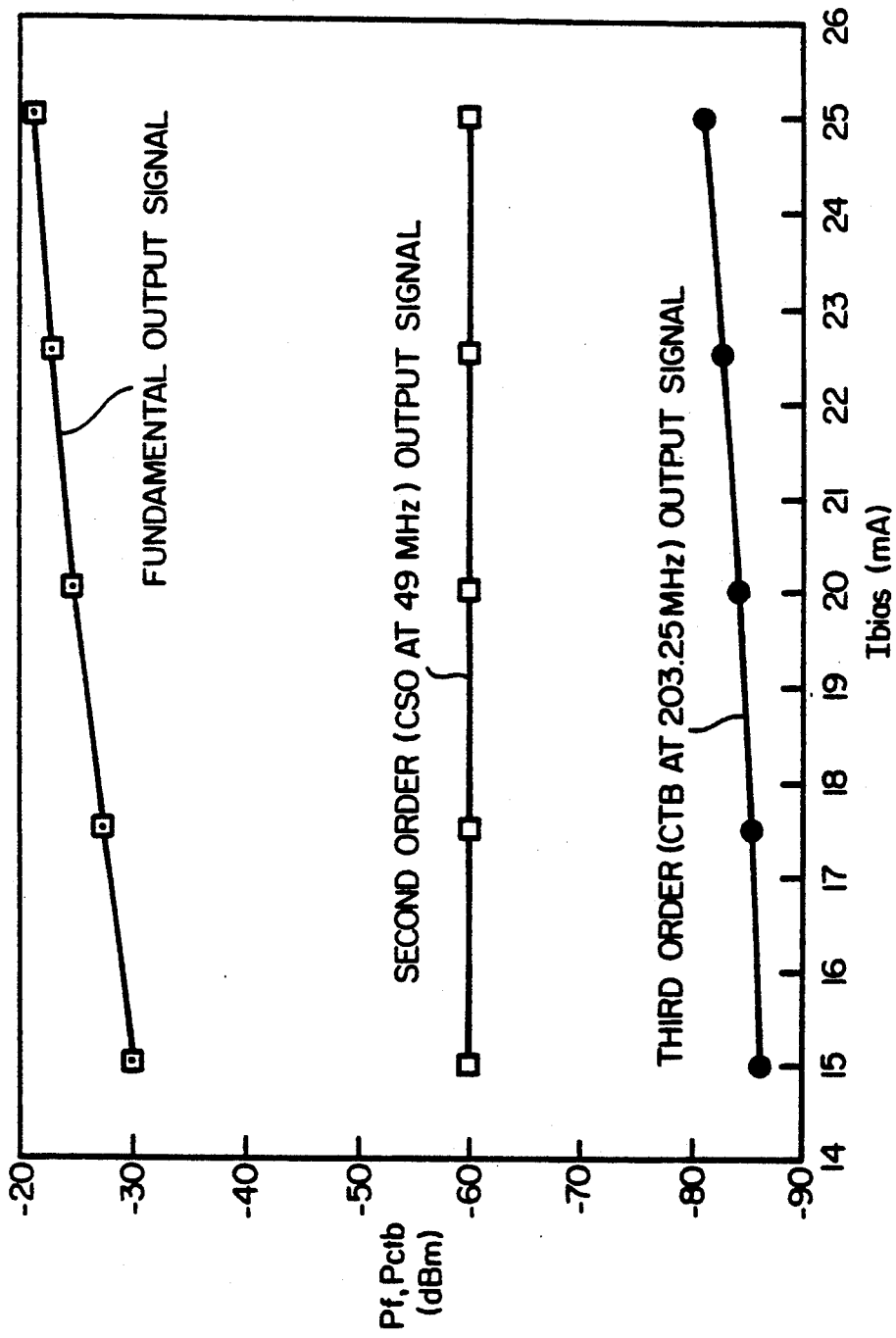
FIG_1B

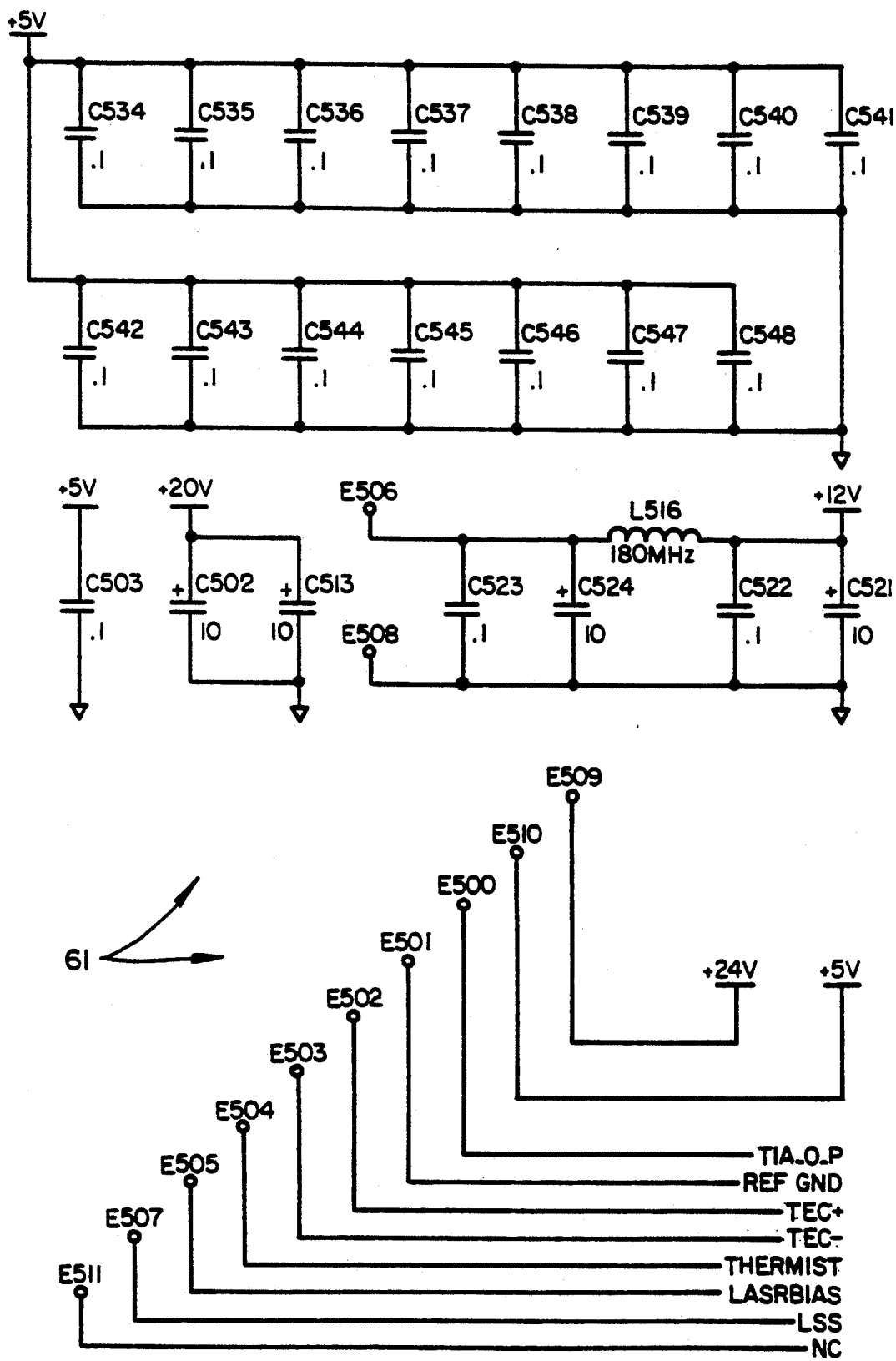
FIG_1a

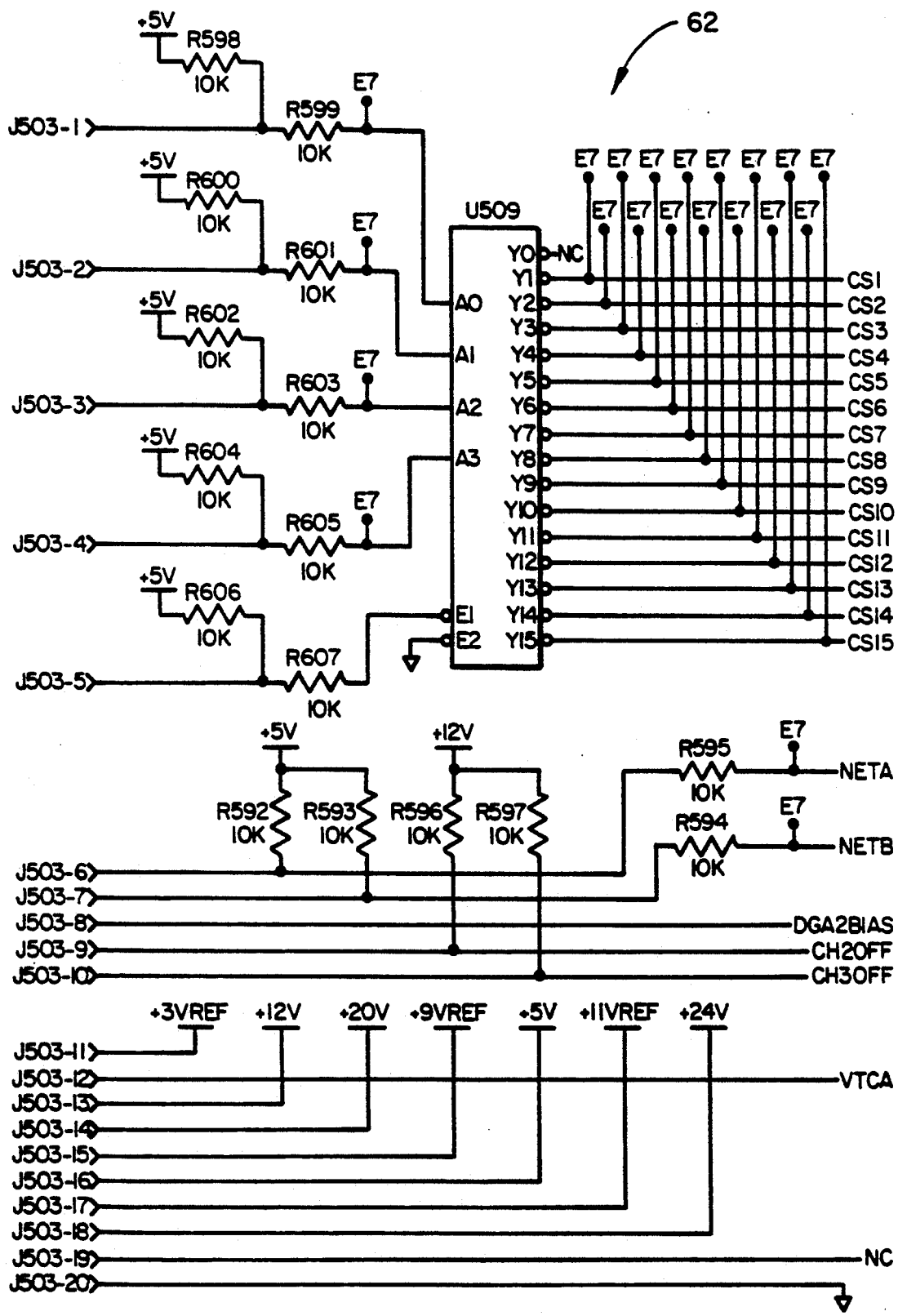
FIG_1b

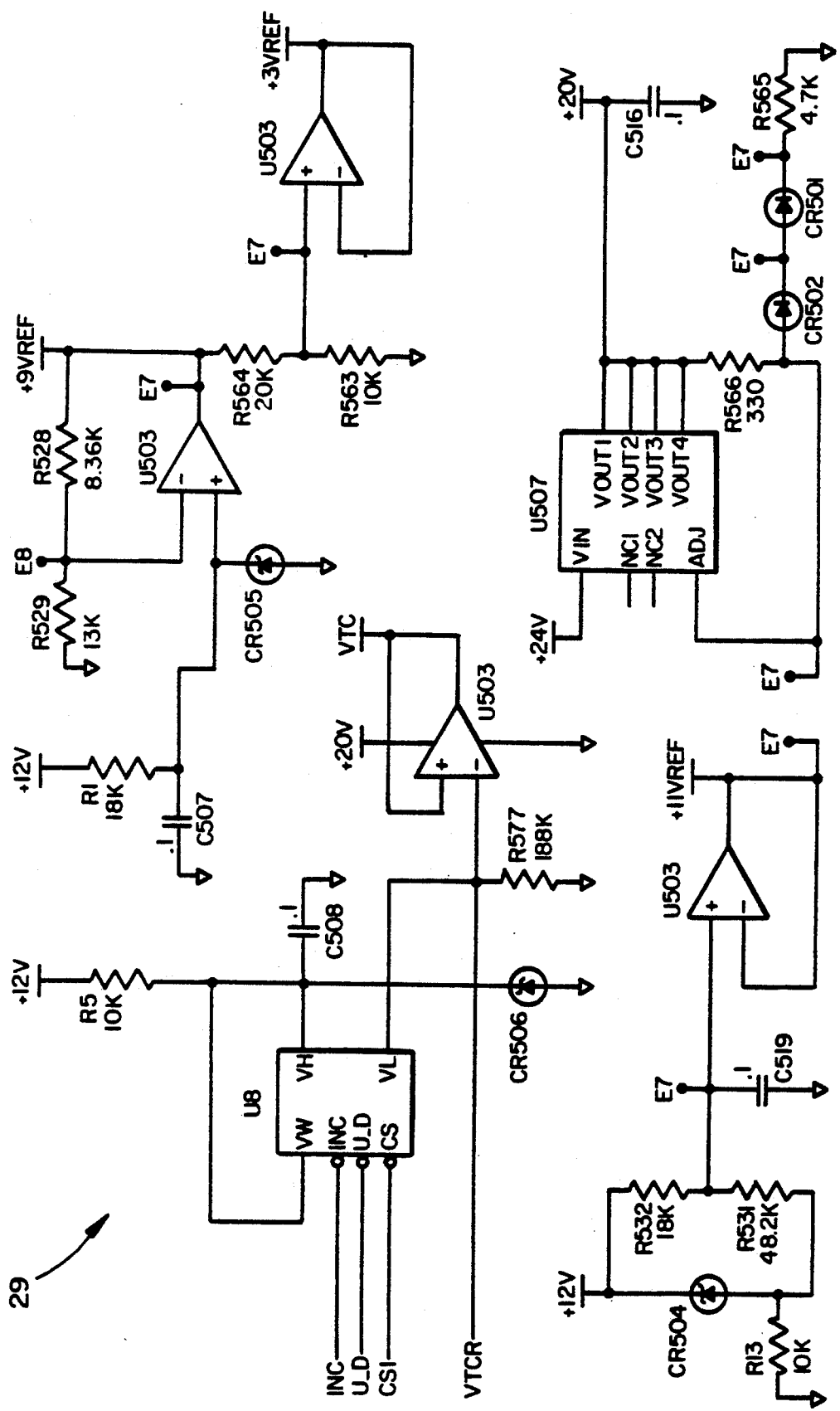
FIG_2

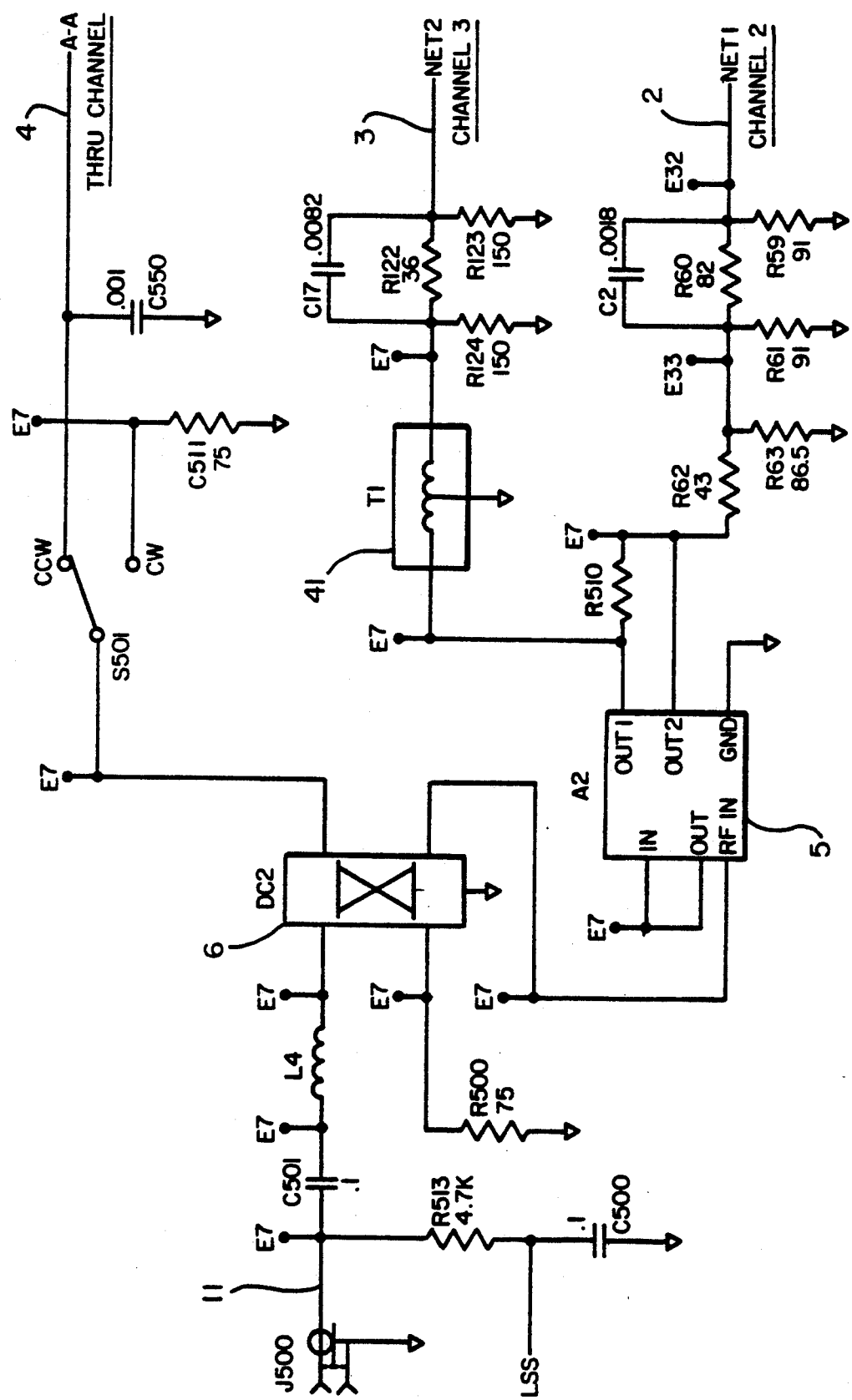
FIG_3a

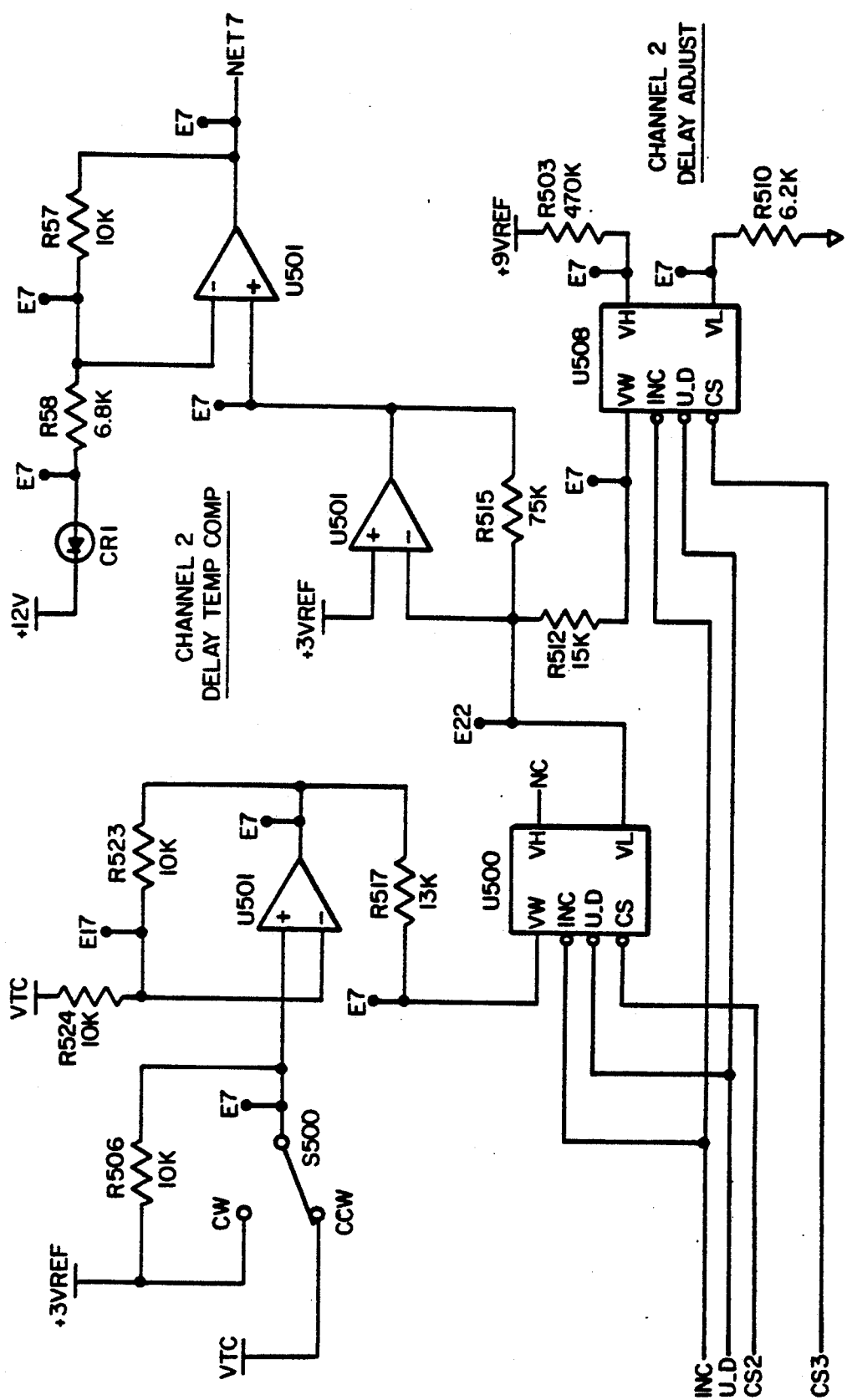
FIG_3b

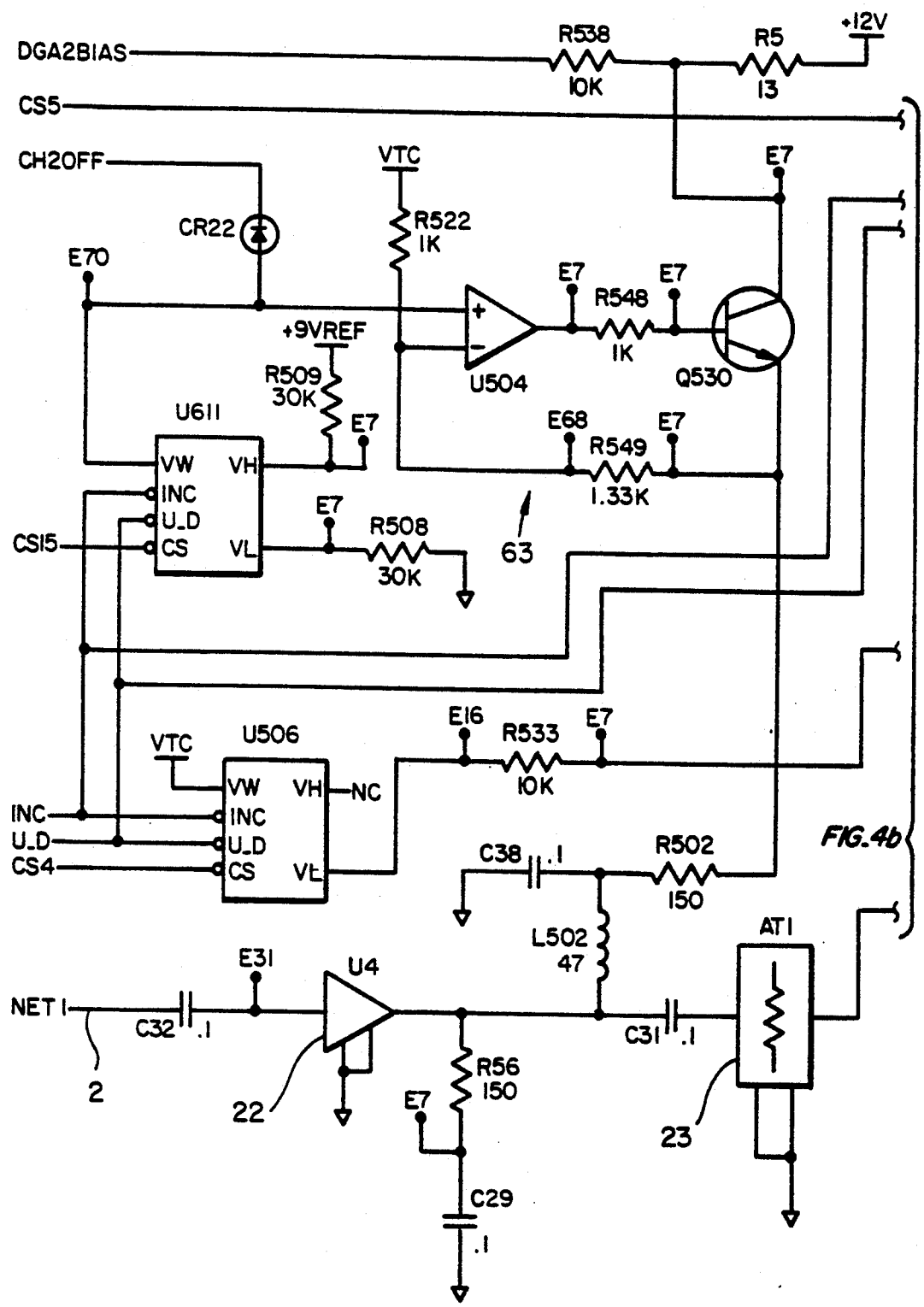
FIG_4a

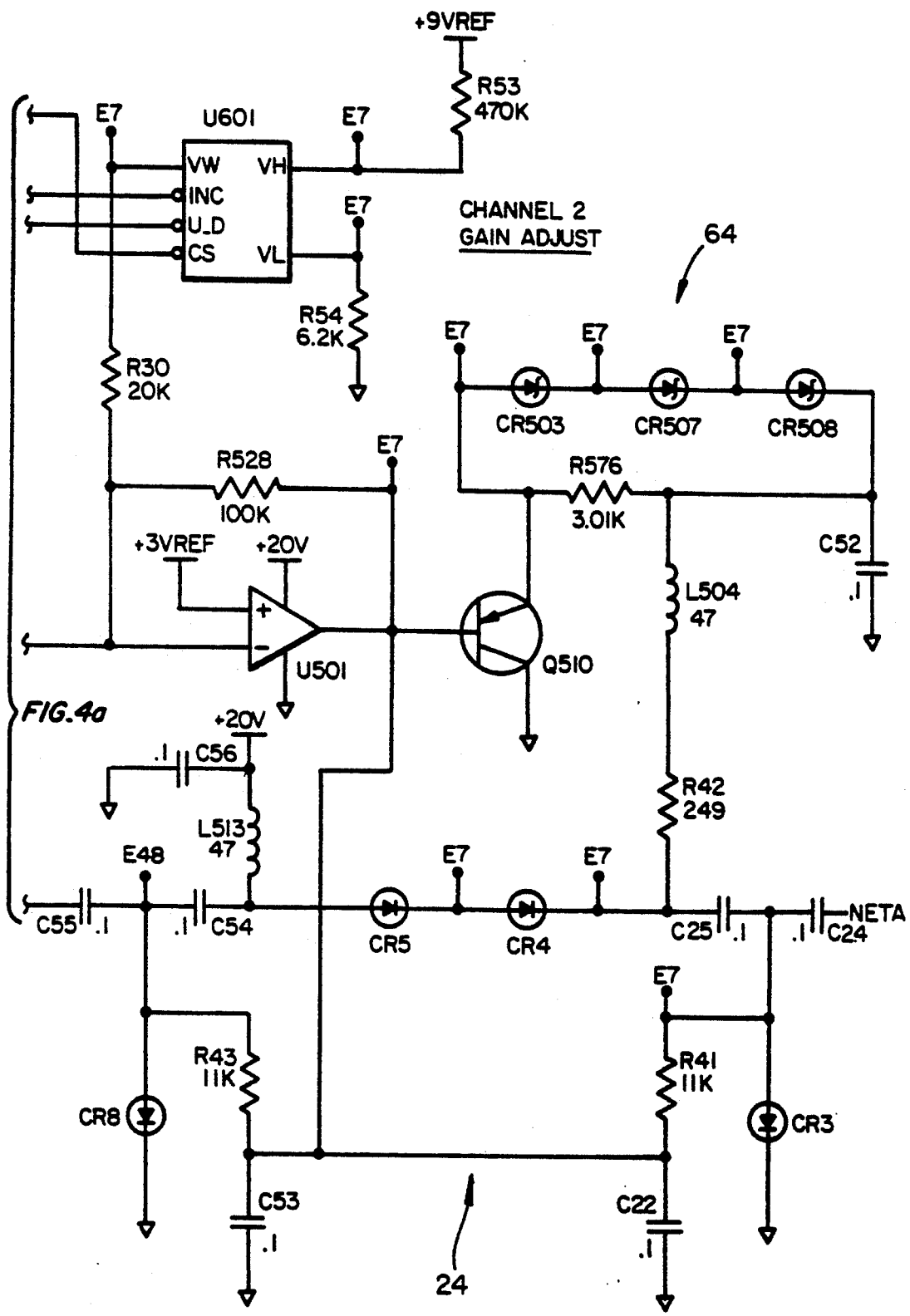
FIG_4b

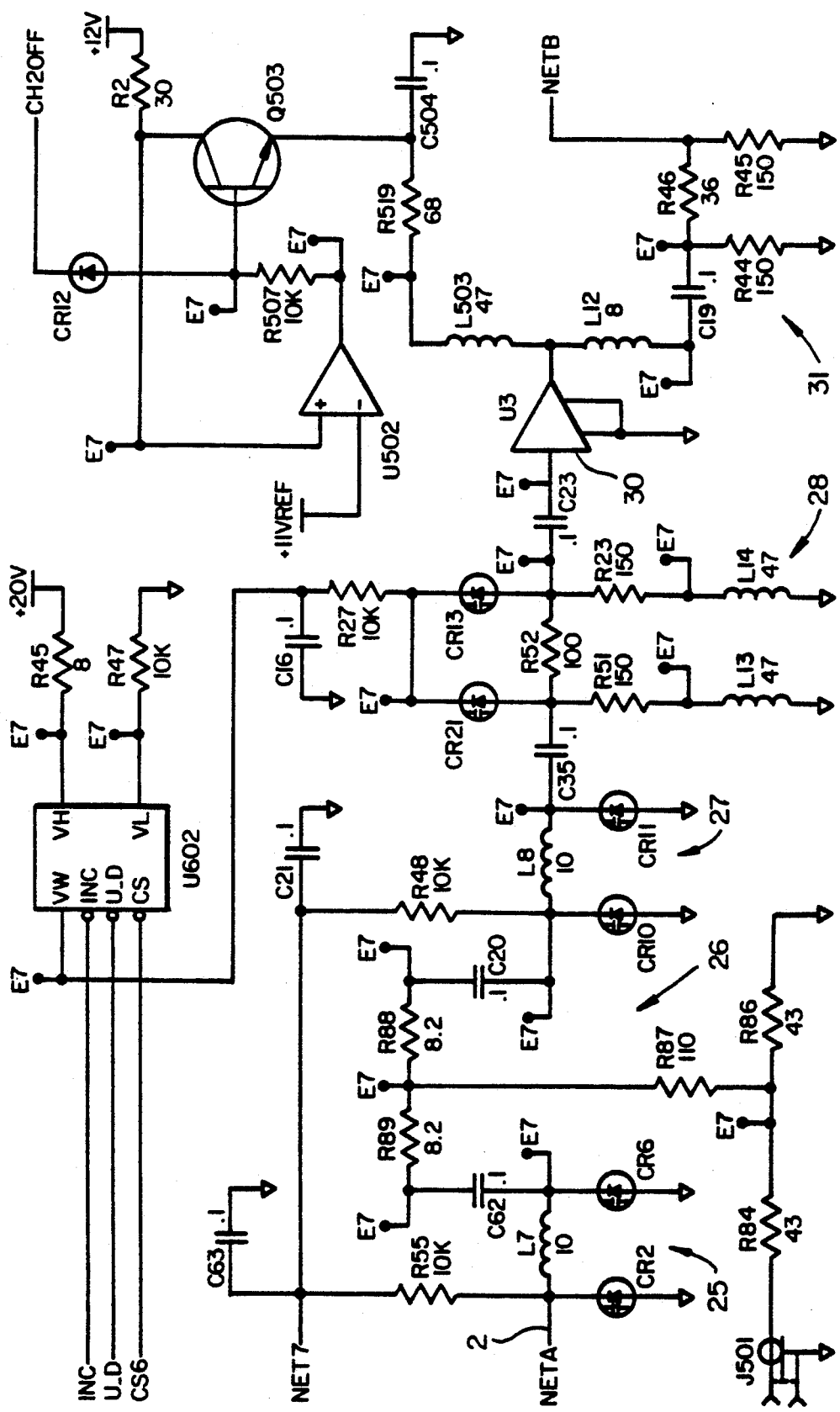
FIG_5

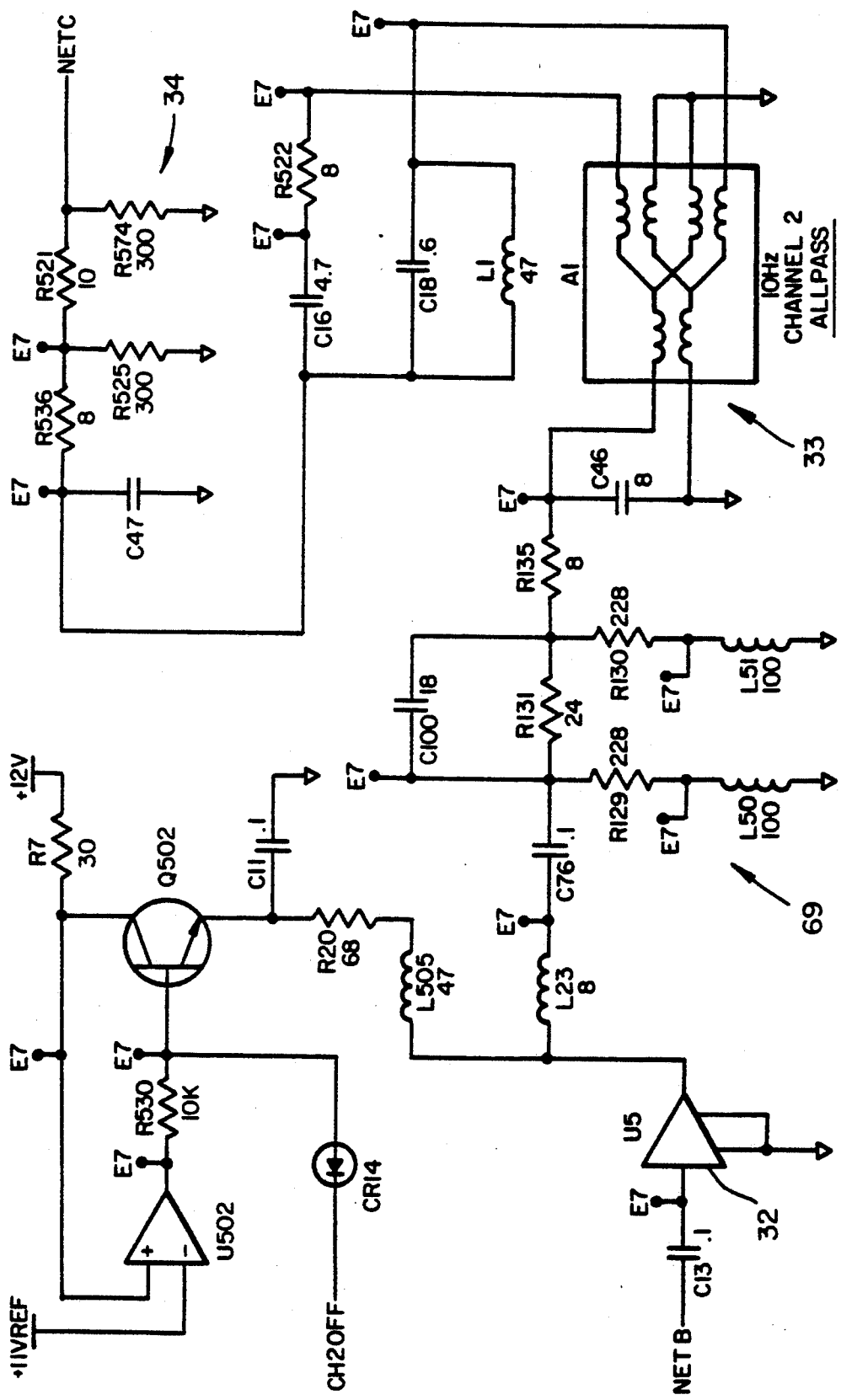
FIG_6

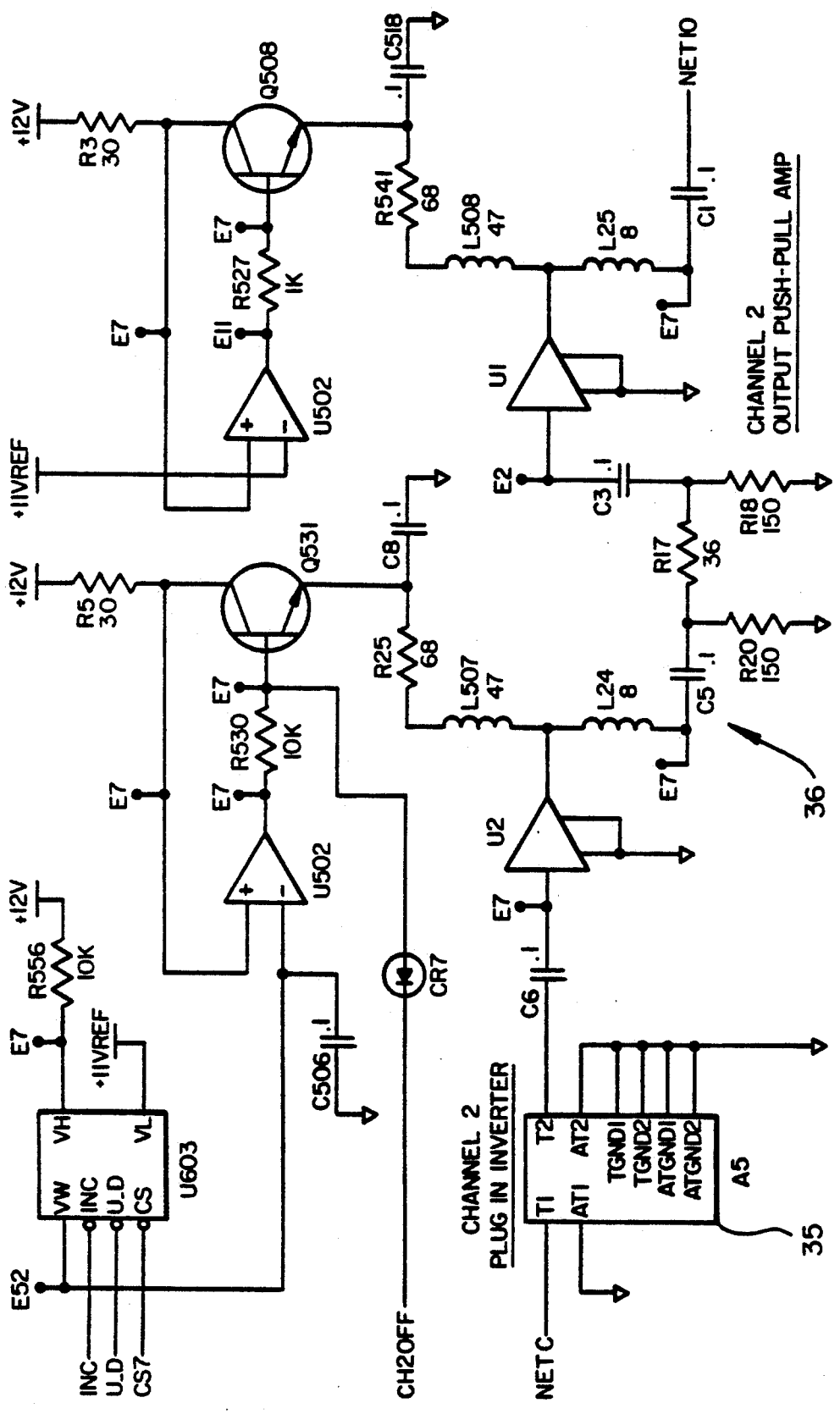
FIG_7

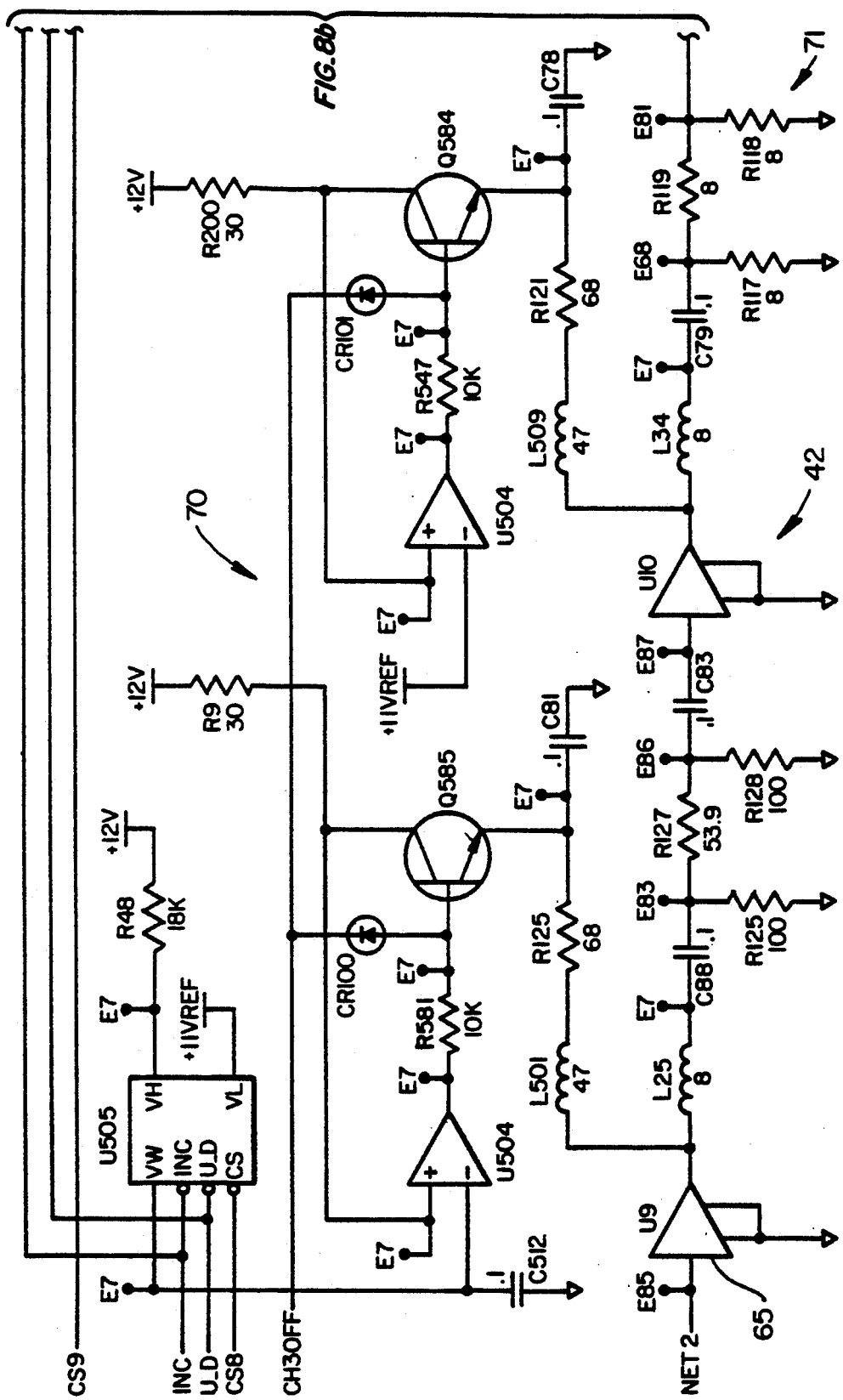

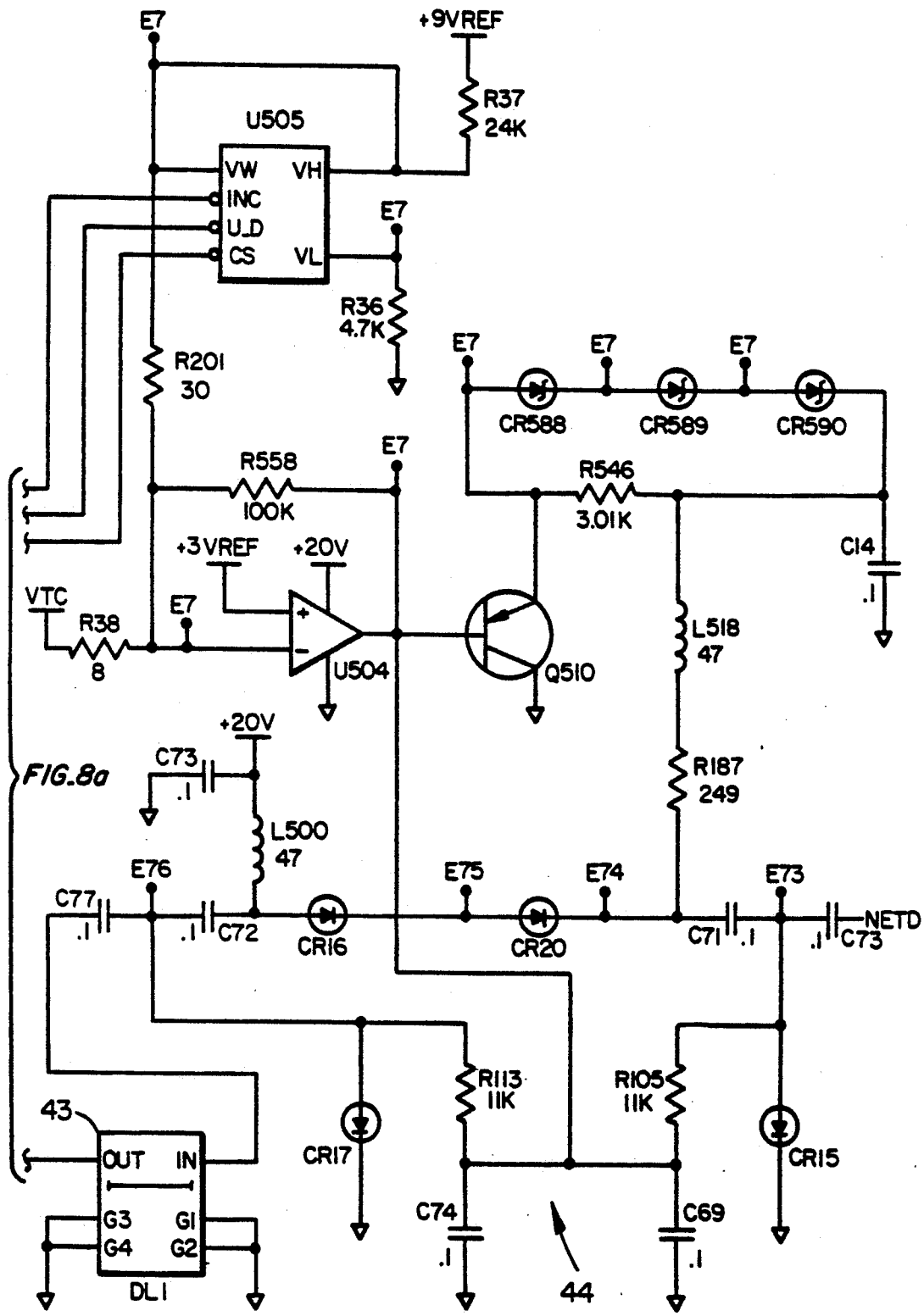
FIG_8b

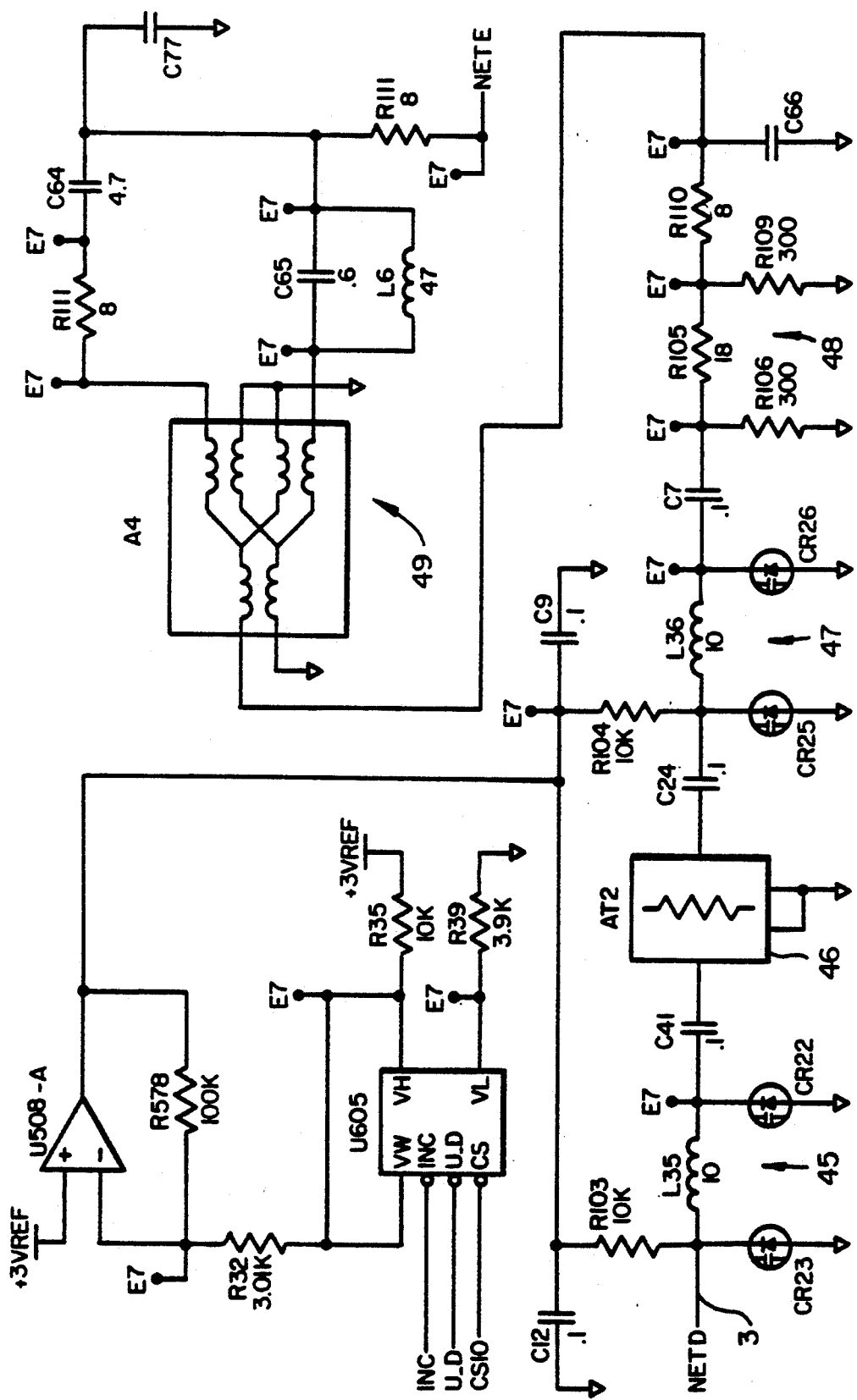
FIG_9

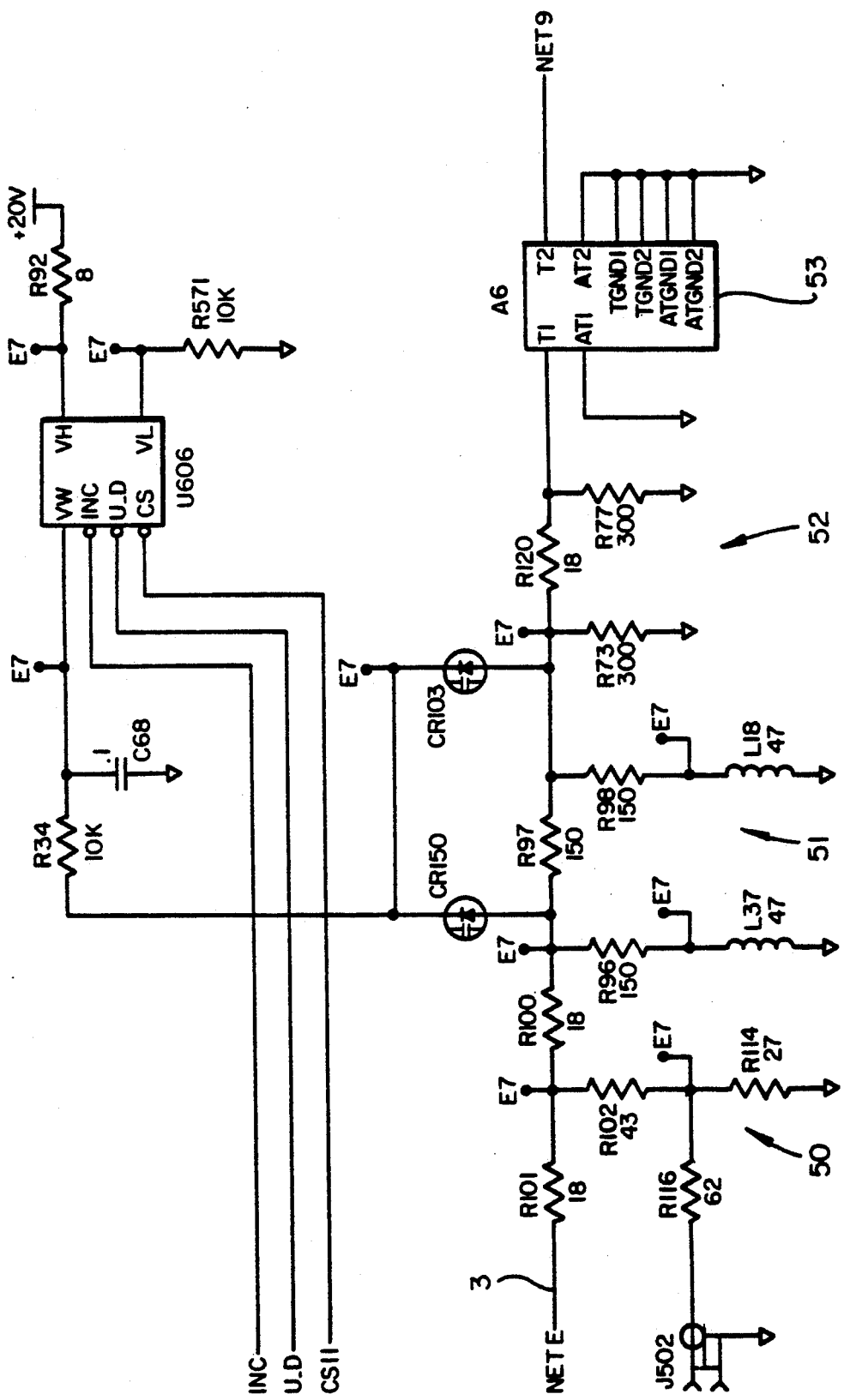
FIG_10

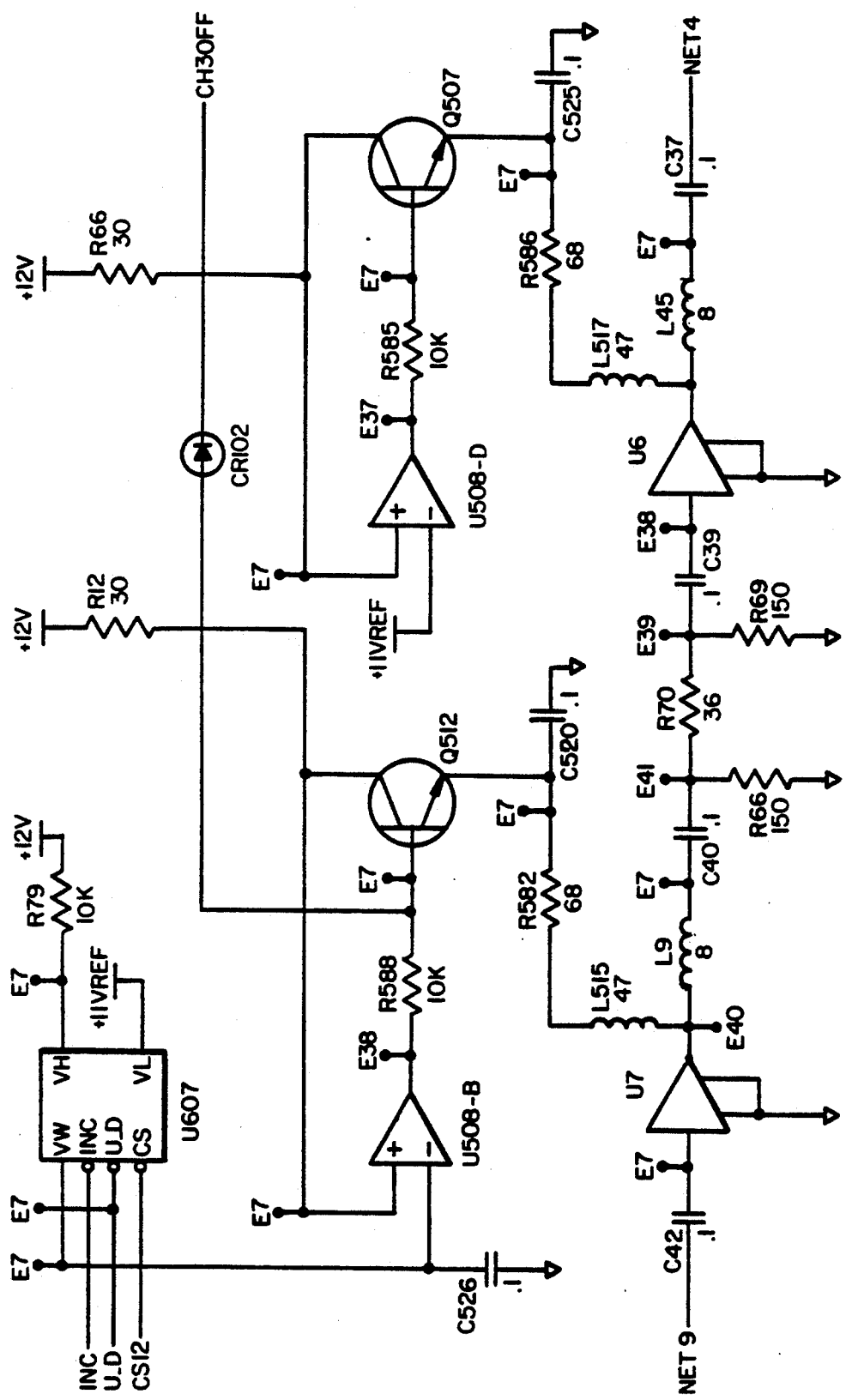
FIG_11

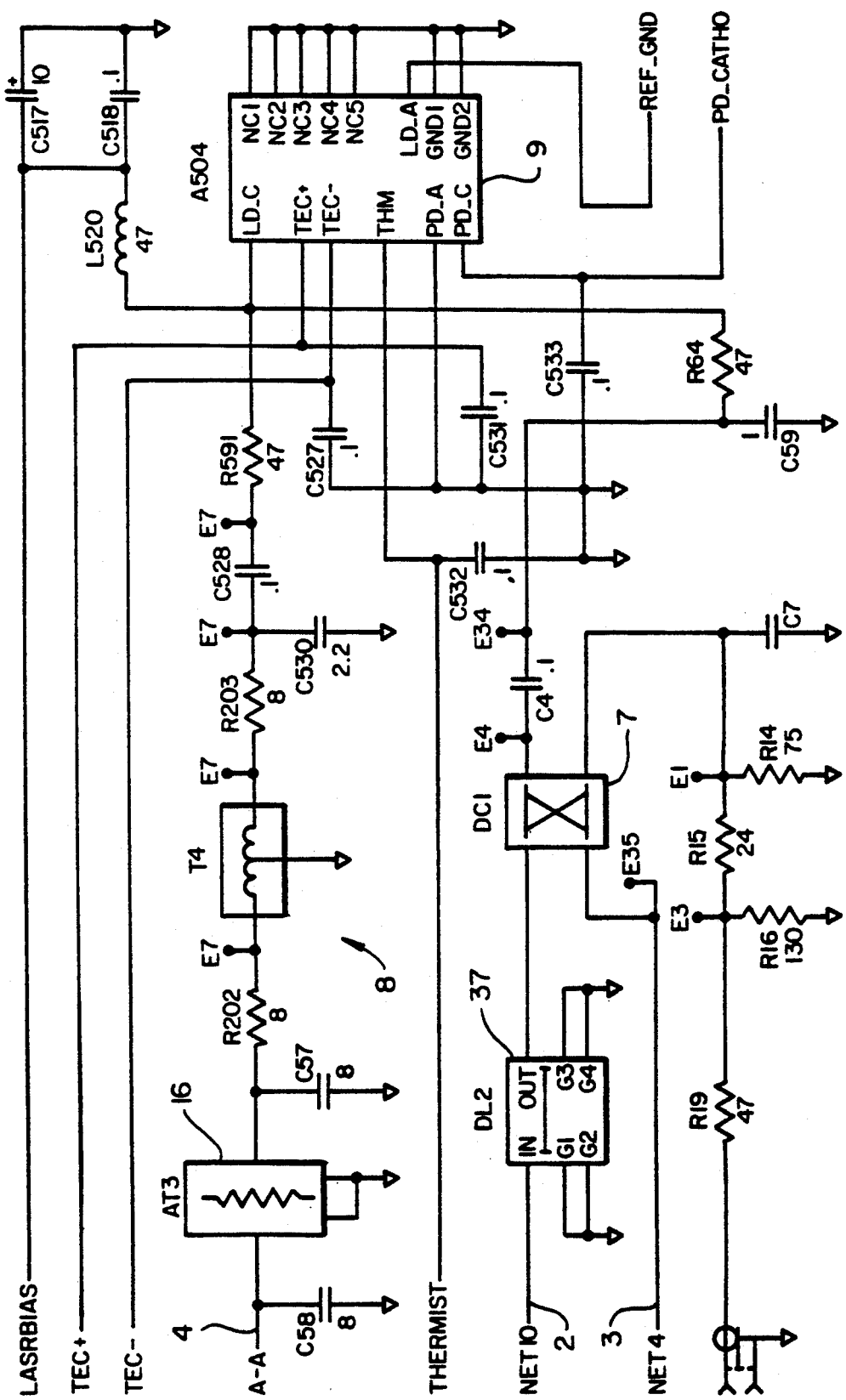
FIG_12

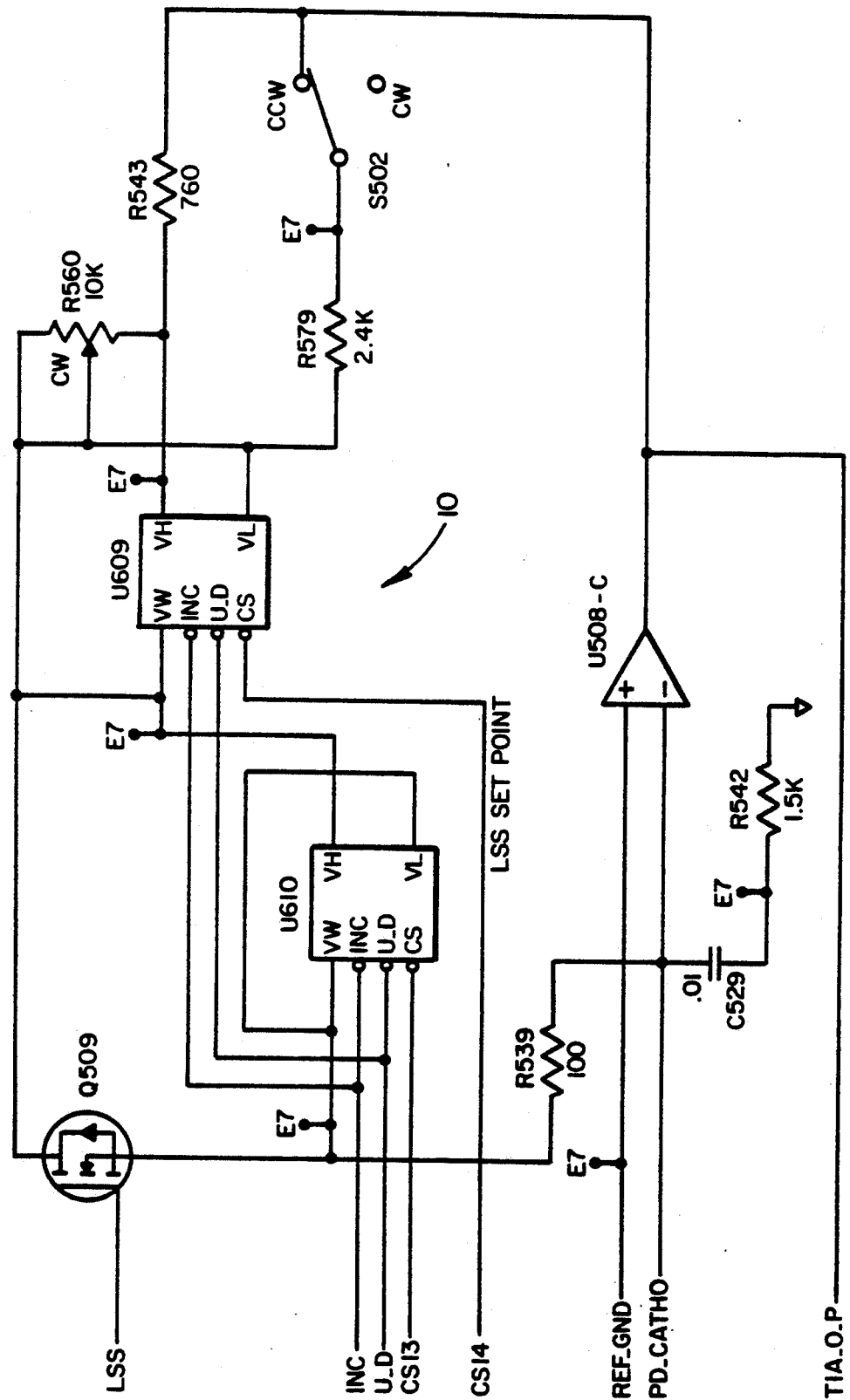
FIG_13

PREDISTORTION METHOD AND APPARATUS FOR LASER LINEARIZATION

FIELD OF THE INVENTION

The present invention relates to signal processing methods and apparatuses for linearizing a laser. More particularly, the present invention relates to methods for generating and applying controlled second order and optionally higher orders of predistortion to a broadband RF electrical signal in order to linearize a DFB optical laser diode operating in an analog optical modulation mode.

BACKGROUND OF THE INVENTION

In cable television signal distribution systems, many separate RF television channels are simultaneously transmitted over a transmission line, and a required bandwidth thereof may extend from as low as about 40 MHz to as high as about 1 GHz. Presently, cable television distribution systems conventionally employ coaxial cable as the transmission line for the RF spectra. Due to the significant signal losses inherent with coaxial cable transmission lines, repeater amplifiers must usually be provided at closely spaced distances, such as at every half mile along the extent of the network. These repeaters are expensive, require a constant power supply, introduce cumulative distortion, and must be maintained in order to provide continuous cable service to subscribers.

Analog fiber optic networks have been proposed as a replacement for coaxial cable transmission lines within broadband telecommunications and cable television networks. Such networks operate successfully over vastly greater distances between repeaters. Typically, a laser diode may be used as a transmitter within such networks. Unfortunately, laser diodes are known to produce intermodulation distortion. Modern distributed feedback ("DFB") lasers exhibit significant and unacceptable amounts of intermodulation distortion, particularly composite second order (CSO) distortion products, i.e. distortion products of the type $2f_1$, $2f_2$, $f_2-f_1$, and $f_2+f_1$. Though second order intermodulation distortion can be eliminated by limiting an RF signal to a narrowband range, i.e. by keeping a maximum frequency $f_{mx}$ less than twice a value of a minimum frequency $f_{mn}$, this solution is relatively expensive since higher transmission frequencies are required for a given bandwidth. Predistortion techniques have therefore been proposed as one method for improving distortion levels at the DFB laser output for broadband transmissions. As used herein "broadband" means any signal where the highest frequency being transmitted is greater than twice the lowest frequency being transmitted.

"Low cost" DFB lasers designed for analog applications exhibit CSO levels in the 52–56dB range below a level of the fundamental at five percent optical modulation index (OMI) for a 36 channel phase alternating line (PAL) frequency plan. In order to meet a nominal 67dB CSO level below the fundamental, a predistortion circuit must yield a minimum of 15dB improvement, and be stable over time and temperature.

Blauvelt et al., U.S. Pat. No. 4,992,754, the disclosure of which is incorporated herein by reference, discloses a predistortion circuit whereby an RF input signal is split into a primary and secondary electrical path, with composite second order distortion products being generated in the secondary electrical path by two amplifiers arranged in a push-push configuration. The distorted electrical signal in the secondary path is then combined into the primary electrical path and fed to the laser. A disadvantage of this technique is that the push-push amplifier configuration requires a 180° hybrid splitter. Such splitters inherently have significant nonlinear frequency characteristics that introduce amplitude and phase errors that can limit the cancellation levels achieved by the predistortion circuit Single channel architectures utilizing transistors (FETs) and diodes have also been proposed. However, these designs fail to achieve acceptable levels of distortion reduction over a multichannel broadband frequency. Also, these approaches are generally not capable of dealing effectively with lasers having frequency dependent distortion characteristics and therefore do not achieve more than 3–5dB of improvement.

SUMMARY OF THE INVENTION

According to the invention, CSO distortion products are minimized by a predistortion circuit that generates second order distortion products using a single distortion generating amplifier biased at a starvation current level. The output of the amplifier, which is inverted relative to a primary RF through path signal, is amplified to a level such that the second order distortion products therein are approximately equal in amplitude to those which are generated by the laser's characteristics. The phase of the distortion products of the amplifier output is adjusted to be approximately 180° out of phase with respect to the distortion signals generated by the laser. Slope equalizer circuitry is applied to the amplifier output to tilt and therefore match the frequency dependence of the predistortion circuit to the frequency dependence of the laser. Optionally a third RF through path can be used to generate third order distortion products using a balanced series push-pull amplifier arrangement. These products are similarly amplified, delayed and tilted to match and cancel those generated by the laser's characteristics when combined with the primary and secondary signals.

These and other objects are achieved by an apparatus for linearizing a broadband modulated optical output of an optical laser diode transmitting a broadband modulated signal, comprising:

means for splitting a broadband input signal into a first electrical component and a second electrical component;

a distortion generating amplifier for utilizing the second component and generating therefrom a distorted second component containing controlled levels of intermodulation distortion products;

means for adjusting an amplitude and phase of the distorted second component so at least some intermodulation distortion products therein at least partially cancel intermodulation distortion products generated by the laser diode in response to the first electrical component over a broadband frequency spectrum of the first electrical component;

means for combining the first component and the second distorted and adjusted component;

means for inputting the combined components into the optical laser diode.

BRIEF DESCRIPTION OF THE DRAWING(S)

FIG. 1A illustrates in block schematic format a first preferred embodiment of the invention.

FIG. 1B illustrates a transfer characteristic of an amplifier used to generate predistortion intermodulation products according to the present invention.

FIGS. 1-13 illustrate details of an electrical schematical implementation of the circuit illustrated in block format in FIG. 1A, with:

FIG. 1 illustrating input connections and decoding for programmable potentiometer addressing;

FIG. 2 illustrating a reference voltage generation and a voltage source whose output is linearly related to temperature;

FIG. 3 illustrating an RF input and couplers for dividing the input into first, second and third paths;

FIGS. 4-7 showing details of the second path used for generating and processing the composite second order predistortion signal;

FIGS. 8-11 illustrating detailed circuitry for the third path used for generating and processing the third order or composite triple beat signal;

FIG. 12 illustrating circuitry used for combining the three paths and applying a combined signal to a laser diode; and FIG. 13 illustrating details of a transimpedance amplifier for converting the back facet photocurrent to a voltage that is proportional to the optical output level.

DESCRIPTION OF THE PREFERRED EMBODIMENTS

The non-linear effects of the DFB laser diode generate distortion components of particular amplitude and phase. The function of the predistortion circuit is therefore to generate these distortion components and inject them into the laser with equal amplitude but opposite phase to those products generated by the laser itself. These vector signals will then cancel, resulting in reduced distortion.

According to the invention, CSO distortion products are generated by utilizing a single stage distortion generating amplifier 22. The amplifier 22 comprises a monolithic microwave integrated circuit operated in a starved current mode. This distorted signal is combined with the RF input in an antiphase manner so as to minimize second order distortion products. A magnitude of the fundamental of the laser output is minimally affected since a magnitude of the fundamental in the secondary path is relatively small.

An optional feature of the invention is to provide an additional distortion path for separately generating composite triple beat (CTB) or third order distortion products. According to a preferred embodiment of the invention, the third order distortion generating amplifier comprises a series push-pull amplifier arrangement which inherently generates odd order distortion products, including a fundamental, and this distorted signal is combined with the RF input in an antiphase manner so as to minimize third order distortion products. Again, magnitude of the fundamental at the laser output is minimally affected since a magnitude of the fundamental in the third path is relatively small. Since the third order distortion generating amplifier comprises a series push-pull amplifier arrangement, this amplifier does not generate any significant unwanted CSO distortion products which would otherwise interfere with cancellation of CSO distortion products being provided by the distortion generating amplifier 22 and associated circuitry.

The monolithic microwave integrated circuit amplifier 22 preferably comprises a bipolar transistor amplifier array connected as a Darlington pair. As indicated, the monolithic amplifier 22 is operated at a starved current mode. In this context "starved current" means an operating bias current which is substantially lower than the normal operating bias current for the amplifier. Operating an amplifier at a starved current mode creates high distortion output levels. As the bias current is reduced from the normal operating bias current level the distortion of the amplifier 22 output increases, importantly, the second order distortion levels increase more rapidly than the third order distortion levels. This is illustrated in the graph of FIG. 1B for a monolithic amplifier type MSA0370 obtainable from Avantek located in Santa Clara, Calif. This amplifier has a normal bias operating point of 35 mA.

The FIG. 1B graph shows fundamental, second and third order output levels generated by the amplifier. At each bias current the fundamental RF power at the amplifier input was adjusted to maintain Pcso(49 MHz)=-60 dBm at the amplifier output. This graph plots the changes in fundamental output power Pf and power output in the largest CTB cluster, Pctb (203.25 MHz), vs operating bias current for constant composite second order power (Pcso=-60 dBm). This test was conducted using the 36 channel PAL-B frequency plan measuring CTB at 203.25 MHz and composite second order at 49 MHz. A design goal is to keep the CTB signal at 203.25 MHz at least 20 dB below the CSO signal at 49 MHz so that the second order predistortion does not significantly degrade the lasers CTB. For this particular amplifier a 20 dB difference between CSO and CTB is achieved at all bias currents in the range 15 to 25 mA. At very low bias currents (<15 mA) the amplifier gain starts rolling off rapidly; this region could be very sensitive to small changes in bias current and is therefore not a desirable operating mode. An operating current of 20 mA is preferred, where the amplifier characteristics are not highly sensitive to operating bias and where a few dB margin exists for the CTB/CSO ratio.

FIG. 1A illustrates, in block schematic format, a first embodiment of the invention. FIGS. 1-13 illustrate a detailed electrical schematic implementation of the embodiment of FIG. 1A.

Referring to FIG. 1A, a predistortion assembly 1 includes a coupler 6 which splits an RF input 11 into a through channel 4, a second order predistortion channel 2, and a third order predistortion channel 3. Outputs from the predistortion channels 2, 3 are combined by coupler 7, and then combined with the through channel 4 by the laser matching network 8, and the combined signal is fed to a laser 9 controlled by a laser control printed circuit assembly 10. According to the invention, channel 2 generates the CSO distortion products so as to be approximately equal in magnitude and opposite in phase to those inherently being generated by the laser 9 to substantially eliminate second order distortion products. By substantially eliminate, it is meant that the level of the second order distortion products is reduced by several dB by using the invention, nominal results achievable according to the preferred embodiment illustrated in FIGS. 1-13 being in the range of 12-20 dB when used to predistort a commercially available DFB laser diode module such as type FU45-SDF-3 made by Mitsubishi Corporation over a broadband frequency extending from 50 MHz to 600 MHz using a 48 channel, 600 MHz PAL frequency plan set forth in Table 1.

TABLE 1

48 channel PAL signal frequencies (MHz)

48.25
62.25
FM Channels

| 133.25 | 196.25 | 252.25 | 351.25 | 423.25 | 551.25 |
|--------|--------|--------|--------|--------|--------|
| 140.25 | 203.25 | 259.25 | 359.25 | 431.25 | 567.25 |
| 147.25 | 210.25 | 266.25 | 367.25 | 439.25 | 583.25 |
| 154.25 | 217.25 | 273.25 | 375.25 | 471.25 | 599.25 |
| 161.25 | 224.25 | 280.25 | 383.25 | 487.25 |        |
| 175.25 | 231.25 | 287.25 | 391.25 | 503.25 |        |
| 182.25 | 238.25 | 294.25 | 407.25 | 519.25 |        |
| 189.25 | 245.25 | 335.25 | 415.25 | 535.25 |        |

Pilot carrier at 80.15 MHz @ −4 dB
30 FM carriers @ −4 dB

Though DFB lasers have inherently low composite triple beat distortion products, i.e. third order distortion products, such as the type characterized by $2f_1-f_2$, $2f_2-f_1$, etc., if desired third order distortion products can be minimized utilizing the distortion path or channel 3, to be described.

The RF input 11, after passing through LSS coupler 75, and 11 dB coupler 6, to provide signals for channels 2, 3, connects to the through path delay line 15, preferably comprising 5 feet of 0.085 conformable 75 Ω coaxial cable. Most of the RF input is coupled along path 4. The output from the through path delay line 15 connects to quantum efficiency (QE) attenuator 16 which is preferably adjusted during test to set the optical modulation index (OMI) to a desired value, i.e. 4.5%. The output of the attenuator 16 is applied to a 75/50 ohm impedance transformer, laser matching network 8, and into the laser 9.

The second order predistortion path signal is obtained from a portion of the RF input 11 via the coupler 6 and power divider 5 to produce signal 12. An output 12 from the power divider 5 is inputted to attenuator 21 which sets an RF level of a signal going into the second order distortion generating amplifier 22. A gain of the amplifier is preferably approximately 9 dB. A bias current of the amplifier 22 is temperature compensated to maintain constant CSO distortion power over temperature. The output of the amplifier 22 then passes through a plug-in attenuator 23 which covers a range of values chosen to match the laser characteristics. The adjustability of the attenuator 23 provides a broad range of attenuation which is otherwise hard or difficult to achieve with a single PIN attenuator. An output from the plug-in attenuator 23 is then inputted to PIN attenuator 24 which provides an excellent return loss, flatness, linearity, etc. since its range is limited by the inclusion of the plug-in attenuator 23. The range of the attenuation 24 is preferably greater than 12 dB. Preferably half of this range is used for predistortion alignment, and the other half for temperature compensation. Accordingly, the plug-in attenuator provides coarse amplitude adjustment and the PIN attenuator is used for fine amplitude adjustment. According to a preferred embodiment, the amplitude adjustment provided by the PIN attenuator 24 is also dynamically controlled to account for temperature changes by temperature compensation circuit 29. Temperature compensation is achieved by a temperature sensor on the printed circuit board 1, the temperature compensation circuit generating voltages which are summed into the drive circuits for the PIN attenuator 24 to compensate for gain, and summed into the delay adjustment circuits 25, 27 to compensate for delay, both as a function of temperature.

A phase of the signal 12 is adjusted by a variable delay circuit 25 to achieve fine adjustment of the phase. An additional delay adjust stage 27 provides for additional adjustment range, and the delay circuits 25, 27 are both connected to the temperature compensation circuit 29 to provide phase adjustment in response to temperature variations. The use of dual delay stages allows for a broad range of phase adjustment while achieving excellent return loss, flatness, linearity, etc. Resistive coupler 26 is used to isolate the delay circuits 25, 27, and optionally is used to tap off some signal to an RF test port, as illustrated. Accordingly, both amplitude and phase adjustment is achievable as described.

According to a preferred embodiment, a third adjustment which is desirable is to compensate for a nonlinear frequency response of the laser as well as the second order predistortion path, and frequency response adjustment is provided by a slope equalizer 28. Since a frequency dependence of distortion varies from laser to laser, the slope equalizer 28 is optimally adjustable. The three adjustments thus described, that of gain (amplitude), delay (phase), and frequency dependence (slope), can optimally all be made electronic adjustments by a programmable computer which initially sets these levels when assembling the predistortion circuits 2, 3 with the laser 9 and its associated control assemblies 10. Alternatively, the adjustments can be done manually.

An output of the slope equalizer 28 is amplified by utilizing a series push-pull amplifier arrangement 30-32 which comprises a first monolithic amplifier stage 30, a attenuator 31 which provides a small amount of attenuation, and another monolithic amplifier stage 32. The series push-pull amplifier 30-32 provides roughly 17 dB gain while generating minimal even ordered (i.e. second order) distortion products. An allpass circuit 33 corrects for phase nonlinearities of the slope equalizer since the slope equalizer circuit 28 has a certain nonlinear phase characteristic which needs to be compensated for if cancellation over a broadband range of frequencies is desired. Attenuator 34 provides a signal level adjustment and provides return loss protection. Plug-in inverter 35 is useful to provide a capability of inverting the distortion signal 12 by 180° if such capability is required by a particular laser which may require an opposite phase. Another series push-pull amplifier 36 provides further amplification while generating minimal even order distortion products. A plug-in delay line 37 is then provided for coarse delay adjustment, and an 11 dB coupler 7 combines a signal from the distortion path 3 with the signal from the path 2 which is then combined with the through path signal 4 by the laser matching network 8.

Channel 3 has a structure similar to that of channel 2 except that the distortion generating amplifier 42 comprises a series push-pull amplifier rather than a single monolithic integrated circuit amplifier 22, and a 75/50 ohm impedance transformer 41 is utilized at the amplifier input since in this application the amplifier input level requirement cannot be satisfied using resistive impedance match.

Channel 3 includes the series push-pull third order distortion generating amplifier 42 in series with a plug-in delay line 43, a PIN attenuator 44, first and second delay adjustment stages 45, 47 interconnected by a plug-in attenuator 46 and a further fixed attenuator 48. The series push-pull amplifier 42 has first and second amplifier stages of equal gain separated by a 5 dB attenuator and generates minimal second order products while generating substantial third order products. An allpass circuit 49 compensates for a phase nonlinearity of a slope equalizer 51. Also provided is a resistive coupler 50, again with an RF test port, another 3 dB attenuator 52, a plug-in inverter 53, and a series push-pull amplifier 54. These are essentially the same circuit building blocks shown in a slightly different sequence as shown in channel 2, the rearrangement being provided to achieve slight tradeoffs about return losses or interaction of circuits 2, 3. Laser control printed circuit assembly 10 provides standard laser control functions known in the art.

FIGS. 1-13 show detailed electrical schematics of a preferred implementation of the embodiment illustrated in FIG. 1A. In these figures, unless specified otherwise, the schematic diagrams are interpretable per ANSI Y14.15, symbols per ANSI Y32.2 and reference designations per ANSI Y32.16. Resistance values are in ohms, capacitance values are in microfarads, numbers in parentheses at end of signal indicate continuation to other sheets, NC means no connection, numeral 7 means nonstandard symbols, numeral 8 boxed means the feature is not installed (i.e. pure optional), and numeral 9 boxed means the feature is selected at test.

FIG. 1 basically shows a sequence of EPADS 61 which comprises a connector which interconnects the laser control board 10 to the predistortion board, with the EPADS bringing up the +5 V, +12 V, +20 V voltages. Reference numeral 62 illustrates a decoder for driving programmable potentiometers that allows computer adjustment of the circuitry.

FIG. 2 illustrates a voltage for temperature compensation (VTC) circuit 29 which is used in various places throughout the predistortion board circuitry for providing temperature compensation to gain, phase, and generates reference voltages and reference voltage generation.

FIG. 3 illustrates RF input 11, coupler 6 which divides the input into a through path 4 and distortion generating paths 2, 3. The circuit at the bottom of page 3 comprises control and temperature compensation for the delay adjust circuits.

FIG. 4 shows a continuation of channel 2 from FIG. 3. Channel 2 enters the second order distortion generating amplifier 22 which is biased by biased circuitry 63. The distortion generating amplifier 22 generates a composite second order signal power of −60 dBm at 49 MHz, a fundamental output of −30 dBm and a CTB power of < −80 dBm at 203.25 MHz, for a 36 channel PAL B spectrum. FIG. 4 further shows the plug-in attenuator 23, the PIN attenuator 24, and the pin attenuator bias circuit 64. This circuit includes two programmable potentiometers, U501 and U508 which are used to adjust the nominal PIN attenuation and temperature compensation, respectively.

The PIN attenuator output is applied to a filter circuit 25-27 (FIG. 5) that is used to adjust the delay through channel 2. This filter is formed by a 10 nH inductor, and a pair of shunt varactor diodes in a PI configuration. The delay of this circuit is controlled by varying the bias to the varactors over the range 1-18 V yielding a phase variation of >15° at 427.5 MHz (the frequency where the maximum beat count occurs, in the high band, for the 450 MHz PAL signal). Two such stages are employed in channel 2 giving a total phase range of ±15° at 427.5 MHz. The 1 dB corner frequency of this filter network is always greater than or equal to 800 MHz allowing delay adjustment with minimal amplitude variations.

The output of the first delay adjustment stage is connected to a resistive coupler with 3 dB loss to the through port and 26 dB loss to the coupled port which is matched into a 75Ω load impedance and provides an RF monitor point. Due to the high loss from the through port to the coupled port it is not necessary to terminate this connector when not in use; the return loss presented to the through path remains −20 dB. The output of the resistive coupler is connected to the second delay adjustment circuit.

The signal then passes through an adjustable slope equalizer circuit 28 the slope of which is controlled by the bias voltage on a pair of back to back varactor diodes; the bias voltage range is 8 to 15 V. This voltage is set by a programmable potentiometer. The slope equalizer has a range of 2.5 to 6.5 dB slope. The 2.5 dB minimum slope is used to compensate for roll-off through the channel 2 circuits giving a net slope range of 0 to 4 dB. The effective phase non-linearity of this circuit varies over a range of 3° to 11° at 250 MHz. This nonlinearity is compensated by the allpass network 33.

The signal is then applied to an RF amplifier stage 30. This stage forms half of a series push-pull amplifier pair 32 and the 5 dB attenuator 31 formed by three resistors. The alignment of this push-pull amplifier is not tuned during test; the current through both stages is fixed by component values in the constant current drive circuits. Tuning is not required since the distortion contribution of these amplifiers is low.

The signal then passes through the allpass network 33 which is formed by a 50/200Ω balanced to unbalanced transformer whose outputs are recombined using series and parallel tuned circuits. The phase response of this circuit is adjusted to optimally compensate for the phase nonlinearity of the slope equalizer circuit when set to 4.5 dB slope i.e. middle of range. This results in a phase nonlinearity of <±4° over the 0 to 4 dB net slope adjustment range.

The output of the allpass circuit 33 passes through a 3 dB attenuator 34. The signal then passes through a plug-in inverter circuit 35. This plug-in board can be inserted so as to invert the phase of the signal or to pass the signal without phase inversion, depending on the orientation of the device when inserted. When used in the inverting configuration the signal passes through an inverting transformer. When used in the non-inverting configuration the signal passes through an attenuator whose loss is equal to the loss of the inverting transformer. The output of the inverter is then applied to another pair of MSA0370 amplifiers 36 in series push-pull configuration. The second order distortion levels at the output of this amplifier pair should be minimized to avoid interfering with the desired CSO signal generated by the DGA2. The design goal is to keep the total residual CSO generated by all circuits subsequent to the DGA2 to ≧30 dB below the DGA2 CSO signal. The worst case laser determines the maximum signal levels that will be present at the output of this amplifier stage. A laser operating at +9 dBm with 0.15 W/A efficiency, 4.5% OMI and 50 dB CSO will result in a fundamental level of −27 dBm at this amplifier output. At this level the distortion contribution of this pair of amplifiers must be 30 dB below the distortion generating amplifier 22 composite second order signal. Given that the distortion generating amplifier 22 operates at a nominal composite second order ratio of −30 dB the composite second order level of this series push-pull amplifier must be < −60 dB.

The output of the push-pull amplifier pair 36 then passes through a plug-in delay line which is used to compensate for the device to device variation in delay characteristics of the lasers, and puts the predistortion alignment within the range of the electrically adjustable delay circuit. The output of the delay line passes through a 11 dB coupler (through port) where the output of channel 3 is summed in (coupled port). This combined signal is then applied to the laser input through a 47Ω matching resistor.

FIG. 8 illustrates the detailed circuit implementation of channel 3, including the third order distortion generating amplifier 42 which again comprises a series push-pull amplifier arrangement with a first stage 65 having its bias controlled by a programmable potentiometer 70 to achieve optimum second order cancellation of the push-pull path. Accordingly, the amplifier 42 creates low, optimally, second order distortion products and rich or high third order distortion products. An output of the amplifier 42 is inputted to a attenuator 71 set for 0 dB attenuation, then through a plug-in delay line 43, and PIN attenuator 44.

FIG. 9 illustrates first and second delay adjust circuit stages 45, 47, separated by a plug-in attenuator 46, this arrangement being similar to the circuits 25-27 in channel 2, previously described. This figure further illustrates attenuator 48, and allpass circuit 49.

FIG. 10 illustrates resistive coupler 50, slope equalizer 51, attenuator 52, and another plug-in inverter 53, all having an arrangement similar to that for channel 2.

FIG. 11 illustrates the final series push-pull amplifier arrangement 54 for channel 3 along with associated biasing circuitry.

FIG. 12 illustrates the final portions of the channels 2, 3 and the through path 4, and specifically the QE attenuator 16 for the through path, the laser matching network 8, the channel 2 plug-in delay line 37, and an 11dB coupler 7 for combining channels 2 and 3. The coupler 7 attenuates channel 3 by 11dB and accordingly attenuates the signal on channel 2 a minimum amount, this configuration being preferred since the amplitude of the second order distortion products generated by channel 2 are generally desired to be much higher than the amplitude of the third order distortion products generated by channel 3, and accordingly it is desirable to preserve gain on channel 2. Hence, the non-symmetrical coupler 7 is a preferred device rather than a symmetrical coupler which would result in higher attenuation to the second order distortion products in channel 2. FIG. 12 further shows the combined signals 2-4 being inputted to the laser 9.

FIG. 13 illustrates a transimpedance amplifier which monitors current from a back facet monitor inside the laser module and converts it to a voltage which is then taken down to the laser control board and used as part of a closed loop control to stabilize optical power of the laser.

Though the invention has been described by reference to distortion signals generated utilizing an open loop configuration, a closed loop configuration could be implemented as well. In a closed loop configuration, an output of the laser diode could be monitored at specified frequencies corresponding to specific RF frequencies injected into the RF input so as to dynamically measure either or both composite second order and third order distortion products in the output of the laser diode. Various ones of the circuit components in the electrical paths 2,3 could be adjusted using feedback control so as to adjust either or both an amplitude and phase of the second order and third order distortion products so as to keep such products at an output of the laser at minimum levels.

Though reference to a PAL frequency plan is made herein, it should be noted that the invention is usable for reducing distortion of any broadband frequency plan, such as the National Television Standards Committee (NTSC) frequency plan. Accordingly, to those skilled in the art to which the present invention pertains many widely different embodiments and applications will suggest themselves without departure from the spirit and scope of the present invention. The disclosures and descriptions presented herein are by way of illustration only and should not be deemed to be limiting of the present invention, the scope of which is more particularly set forth in the following claims.

What is claimed is:

1. An apparatus for linearizing a broadband modulated optical output of an optical laser diode transmitting a broadband modulated signal, comprising:
   means for splitting a broadband input signal into a first electrical component and a second electrical component;
   a distortion generating amplifier for utilizing the second component and generating therefrom a distorted second component containing controlled levels of intermodulation distortion products;
   means for adjusting an amplitude and phase of the distorted second component so at least some intermodulation distortion products therein at least partially cancel intermodulation distortion products generated by the laser diode in response to the first electrical component over a broadband frequency spectrum of the first electrical component;
   means for combining the first component and the second distorted and adjusted component;
   means for inputting the combined components into the optical laser diode.

2. The apparatus of claim 1, the distortion products generated by the amplifier including composite second order distortion products which at least partially cancel composite second order distortion products generated by the laser diode in response to the first electrical component over the broadband frequency spectrum.

3. The apparatus of claim 1, the distortion generating amplifier being biased at a starvation bias current level.

4. The apparatus of claim 3, the amplifier comprising a single stage monolithic microwave integrated circuit amplifier comprising a bipolar transistor amplifier array connected as a Darlington pair.

5. The apparatus of claim 2, the distorted second component being adjusted and amplified using at least one balanced push-pull amplifier arrangement.

6. The apparatus of claim 1, the amplitude and phase adjusting means adjusting an amplitude of the distorted second component in response to temperature variations to compensate therefor dynamically.

7. The apparatus of claim 1, the adjusting means adjusting the amplitude and phase as a function of frequency to compensate at least partially for a nonlinear frequency dependence of the distorted second component.

8. The apparatus of claim 2, the splitting means creating a third electrical component from the broadband input signal, and further comprising means for reducing third order distortion products, the third order reducing means comprising:
  a balanced series push-pull amplifier arrangement for amplifying the third electrical component and generating therefrom a distorted third component;
  means for adjusting an amplitude and phase of the distorted third component so that third order distortion products therein at least partially cancel composite third order distortion products generated by the laser diode or by the second order predistortion circuits, in response to the first electrical component;
  means for combining the distorted third component with the first component and distorted second component;
  the inputting means inputting the combined components including the distorted third component into the optical laser diode.

9. A predistortion circuit, comprising:
  means for splitting a broadband input modulation signal for a laser diode into a primary electrical signal and a secondary electrical signal;
  a distortion generating amplifier biased at a starvation current level for amplifying the secondary electrical signal to produce intermodulation distortion products;
  means for adjusting an amplitude and phase of the intermodulation distortion products as a function of frequency for providing frequency dependent predistortion on the secondary electrical signal which will at least partially cancel intermodulation distortion products generated by the laser diode in response to the primary electrical signals;
  means for additively recombining the primary and secondary electrical signals into a single signal for application to the laser diode.

10. The circuit of claim 9, a maximum frequency of the primary and secondary electrical signals being greater than twice a minimum frequency of the primary and secondary electrical signals, the intermodulation distortion products comprising composite second order intermodulation distortion products.

11. A method of reducing distortion in a broadband modulated signal from a laser diode, comprising the steps of:
  splitting an input broadband modulation signal into primary and secondary electrical signals;
  driving an amplifier utilizing the secondary electrical signal;
  applying the secondary electrical signal to the amplifier to generate intermodulation distortion products having an amplitude relatively large compared to an amplitude of a fundamental outputted by the amplifier;
  adjusting an amplitude and phase of the intermodulation distortion products in the secondary signal as a function of frequency to at least partially match a frequency dependence of distortion generated by the laser diode in response to the primary electrical signal;
  recombining the primary and secondary electrical signals for providing an input to the laser diode.

12. The method of claim 11, a maximum frequency of the signal inputted to the laser diode being more than twice as large as a minimum frequency of the signal inputted to the laser diode, the modulated signal comprising an amplitude modulated signal.

* * * * *